US012266645B2

(12) United States Patent
Akimoto

(10) Patent No.: US 12,266,645 B2
(45) Date of Patent: Apr. 1, 2025

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 534 days.

(21) Appl. No.: 17/568,161

(22) Filed: Jan. 4, 2022

(65) Prior Publication Data

US 2022/0131027 A1 Apr. 28, 2022

Related U.S. Application Data

(63) Continuation of application No. PCT/JP2020/025627, filed on Jun. 30, 2020.

(30) Foreign Application Priority Data

Jul. 10, 2019 (JP) .................................. 2019-128493

(51) Int. Cl.
*H01L 33/00* (2010.01)
*H01L 25/16* (2023.01)
(Continued)

(52) U.S. Cl.
CPC ........ *H01L 25/167* (2013.01); *H01L 33/0093* (2020.05); *H01L 33/50* (2013.01);
(Continued)

(58) Field of Classification Search
CPC . H01L 25/0753; H01L 25/167; H01L 27/156; H01L 33/0093; H01L 33/44; H01L 33/58
See application file for complete search history.

(56) References Cited

U.S. PATENT DOCUMENTS 10,134,945 B1 * 11/2018 Liu ...................... H01L 27/156
2010/0026779 A1 2/2010 Yonehara et al.
(Continued)

FOREIGN PATENT DOCUMENTS

CN 102216365 A 10/2011
JP 2002-141492 A 5/2002
(Continued)

OTHER PUBLICATIONS

International Search Report dated Sep. 15, 2020 as issued in PCT Application No. PCT/JP2020/025627 and its English translation thereof (11 pages).

*Primary Examiner* — Peter M Albrecht
(74) *Attorney, Agent, or Firm* — Foley & Lardner LLP

(57) ABSTRACT

A method for manufacturing an image display device includes: providing a second substrate that comprises a first substrate, and a semiconductor layer on the first substrate, the semiconductor layer comprising a light-emitting layer; providing a third substrate comprising a circuit, the circuit comprising a circuit element; bonding the semiconductor layer to the third substrate; forming a light-emitting element by etching the semiconductor layer; covering the light-emitting element with a light-transmissive insulating member; and forming a wiring layer electrically connecting the light-emitting element to the circuit element; wherein: the light-emitting element has a light-emitting surface opposite to a surface of the light-emitting element that is bonded to the third substrate; and the insulating member is configured to cause light radiated from the light-emitting element to have a light distribution in a normal direction of the light-emitting surface toward a light-emitting surface side.

12 Claims, 26 Drawing Sheets

(51) Int. Cl.
   *H01L 33/50*     (2010.01)
   *H01L 33/58*     (2010.01)
   *H01L 33/62*     (2010.01)
   *H01L 33/32*     (2010.01)
(52) U.S. Cl.
   CPC .............. *H01L 33/58* (2013.01); *H01L 33/62* (2013.01); *H01L 33/007* (2013.01); *H01L 33/32* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2011/0278621 A1 | 11/2011 | Herrmann et al. | |
| 2014/0191246 A1* | 7/2014 | Oraw .................. | H01L 25/167 438/25 |
| 2014/0367633 A1 | 12/2014 | Bibl et al. | |
| 2017/0062515 A1 | 3/2017 | Kim | |
| 2017/0170373 A1* | 6/2017 | Peng .................. | H01L 33/0093 |
| 2017/0294480 A1 | 10/2017 | Kwon | |
| 2017/0294565 A1 | 10/2017 | Kim | |
| 2018/0174519 A1 | 6/2018 | Kim et al. | |
| 2019/0097103 A1 | 3/2019 | Chu | |
| 2019/0165035 A1 | 5/2019 | Fu | |
| 2019/0198488 A1 | 6/2019 | Wang | |
| 2019/0252312 A1* | 8/2019 | Yu ...................... | H01L 25/0753 |
| 2019/0302917 A1* | 10/2019 | Pan .................... | H01L 25/0753 |
| 2019/0319073 A1* | 10/2019 | Liao ................... | H01L 25/0753 |
| 2019/0326330 A1* | 10/2019 | Xia .................... | H01L 25/0753 |
| 2019/0385513 A1 | 12/2019 | Iguchi et al. | |

FOREIGN PATENT DOCUMENTS

| | | |
|---|---|---|
| JP | 2008-135419 A | 6/2008 |
| JP | 2016-523450 A | 8/2016 |
| WO | WO-2018/116814 A1 | 6/2018 |
| WO | WO-2018/132070 A1 | 7/2018 |

* cited by examiner

METHOD FOR MANUFACTURING IMAGE DISPLAY DEVICE AND IMAGE DISPLAY DEVICE

CROSS-REFERENCE TO RELATED APPLICATIONS

The present application is a bypass continuation of PCT Application No. PCT/JP2020/025627, filed Jun. 30, 2020, which claims priority to Japanese Application No. 2019-128493, filed Jul. 10, 2019. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (see, e.g., Japanese Patent Publication No. 2002-141492).

SUMMARY

One embodiment of the invention provides a method for manufacturing an image display device and an image display device in which a transfer process of a light-emitting element is shortened, and the yield is increased.

A method for manufacturing an image display device according to one embodiment of the invention includes a process of preparing a second substrate that includes a semiconductor layer including a light-emitting layer on a first substrate, a process of preparing a third substrate in which a circuit including a circuit element is formed, a process of bonding the semiconductor layer to the third substrate, a process of forming a light-emitting element by etching the semiconductor layer, a process of covering the light-emitting element with an insulating member that is light-transmissive, and a process of forming a wiring layer electrically connecting the light-emitting element to the circuit element. The light-emitting element includes a light-emitting surface opposite to a surface of the light-emitting element bonded to the third substrate. The insulating member is provided so that light radiated from the light-emitting element has a light distribution in a normal direction of the light-emitting surface toward the light-emitting surface side.

An image display device according to one embodiment of the invention includes a circuit element, a first wiring layer electrically connected to the circuit element, an insulating film covering the circuit element and the first wiring layer, a second wiring layer located on the insulating film, a light-emitting element that is located on the second wiring layer and includes a light-emitting surface opposite to a surface of the light-emitting element at the second wiring layer side, an insulating member that covers at least a portion of the light-emitting element and is light-transmissive, and a third wiring layer that is located on the insulating member and is electrically connected to the light-emitting element. The light-emitting element includes a first semiconductor layer that is located on the second wiring layer and is of a first conductivity type, a light-emitting layer located on the first semiconductor layer, and a second semiconductor layer that is located on the light-emitting layer and is of a second conductivity type that is different from the first conductivity type. The insulating member is provided so that light radiated from the light-emitting element has a light distribution in a normal direction of the light-emitting surface toward the light-emitting surface side.

An image display device according to one embodiment of the invention includes multiple transistors, a first wiring layer electrically connected to the multiple transistors, an insulating film covering the multiple transistors and the first wiring layer, a second wiring layer located on the insulating film, a first semiconductor layer that is located on the second wiring layer and is of a first conductivity type, a light-emitting layer located on the first semiconductor layer, a second semiconductor layer that is located on the light-emitting layer and is of a second conductivity type that is different from the first conductivity type, an insulating member that covers the first semiconductor layer and the light-emitting layer, covers at least a portion of the second semiconductor layer, and is light-transmissive, and a third wiring layer connected to a light-transmitting electrode located on multiple exposed surfaces of the second semiconductor layer, wherein the multiple exposed surfaces are exposed from the insulating member to correspond respectively to the multiple transistors. The insulating member is provided so that light radiated from the light-emitting layer has a light distribution in normal directions of the multiple exposed surfaces toward the exposed surface side.

According to one embodiment of the invention, a method for manufacturing an image display device and an image display device are realized in which a transfer process of a light-emitting element is shortened, and the yield is increased.

DETAILED DESCRIPTION

Figure 1:
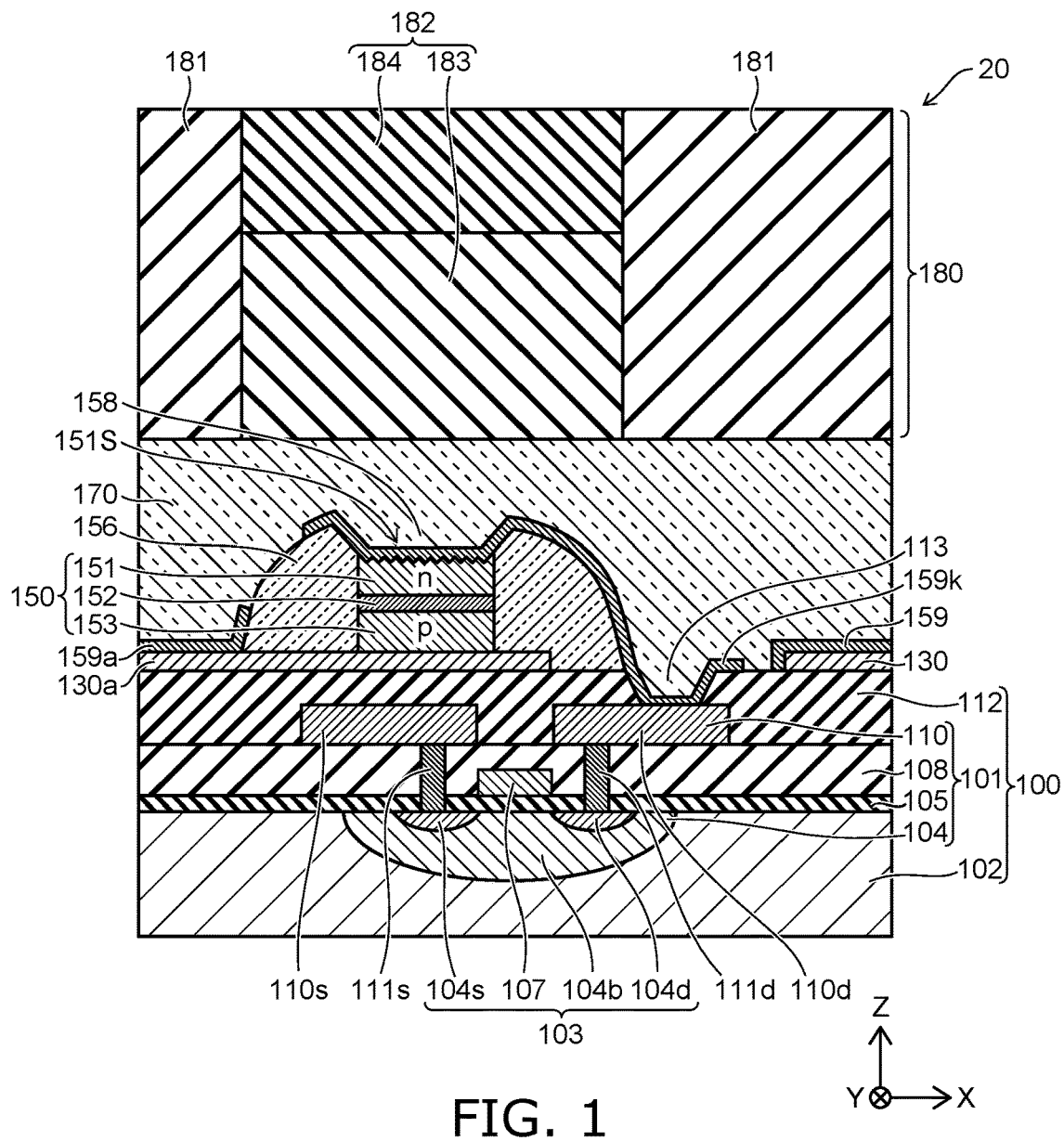
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to an embodiment.

The configuration of a subpixel 20 of the image display device of the embodiment is schematically shown in FIG. 1. A pixel that is included in an image displayed in the image display device includes multiple subpixels 20.

Hereinbelow, the description may use an XYZ three-dimensional coordinate system. The subpixels 20 are arranged on a two-dimensional plane. The two-dimensional plane in which the subpixels 20 are arranged is taken as an XY plane. The subpixels 20 are arranged along an X-axis direction and a Y-axis direction.

The subpixel 20 includes a light-emitting surface 151S that is substantially parallel to the XY plane. The light-emitting surface 151S outputs light mainly toward a positive direction of a Z-axis orthogonal to the XY plane. The length along the positive direction of the Z-axis may be called the height.

FIG. 1 schematically shows a cross section when the subpixel 20 is cut by a plane parallel to the XZ plane.

As shown in FIG. 1, the subpixel 20 of the image display device includes a transistor 103, a first wiring layer 110, an inter-layer insulating film 112, a second wiring layer 130, a light-emitting element 150, and an insulating member 156. According to the embodiment, the insulating member 156 that covers the light-emitting element 150 is light-transmissive and includes a surface that is convex toward the light-emitting surface 151S side.

The subpixel 20 further includes a color filter 180. The color filter (the wavelength conversion member) 180 is located on an adhesive layer 170. The adhesive layer 170 is located on the light-emitting element 150, the insulating member 156, and light-transmitting electrodes 159, 159a, and 159k.

The transistor 103 is formed in a substrate 102. Other than the drive transistor 103, the light-emitting element 150, other circuit elements such as transistors, capacitors, etc., are formed in the substrate 102, and a circuit 101 is configured using wiring portions, etc. For example, the transistor 103 corresponds to a drive transistor 26 shown in FIG. 4 described below; also, a select transistor 24, a capacitor 28, etc., are circuit elements. Hereinbelow, the circuit 101 includes an element formation region 104 in which the circuit elements are formed, an insulating layer 105, the wiring layer 110, vias 111d and 111s that connect the wiring layer 110 and the circuit elements, and an insulating film 108 that insulates between the circuit elements and the like. The substrate 102, the circuit 101, the inter-layer insulating film 112, and other components may be inclusively called a circuit board 100.

The transistor 103 includes a p-type semiconductor region 104b, n-type semiconductor regions 104s and 104d, and a gate 107. The gate 107 is located on the p-type semiconductor region 104b with the insulating layer 105 interposed. The insulating layer 105 is provided to insulate the element formation region 104 and the gate 107 and to sufficiently insulate from the adjacent other circuit elements. A channel may be formed in the p-type semiconductor region 104b when a voltage is applied to the gate 107. The transistor 103 is an n-channel transistor, e.g., an n-channel MOSFET.

The element formation region 104 is located in the substrate 102. The substrate 102 is, for example, a Si substrate. The element formation region 104 includes the p-type semiconductor region 104b and the n-type semiconductor regions 104s and 104d. The p-type semiconductor region 104b is located at the surface vicinity of the substrate 102. The n-type semiconductor regions 104s and 104d are located in the p-type semiconductor region 104b and are separated from each other at the surface vicinity of the p-type semiconductor region 104b.

The insulating layer 105 is located at the surface of the substrate 102. The insulating layer 105 also covers the element formation region 104, and covers the surfaces of the p-type semiconductor region 104b and the n-type semiconductor regions 104s and 104d. The insulating layer 105 is, for example, $SiO_2$. The insulating layer 105 may be a multilevel insulating layer that includes $SiO_2$, $Si_3N_4$, etc., according to the covered region. The insulating layer 105 may include a layer of an insulating material that has a high dielectric constant.

The gate 107 is located on the p-type semiconductor region 104b with the insulating layer 105 interposed. The gate 107 is located between the n-type semiconductor regions 104s and 104d. The gate 107 is, for example, polycrystalline Si. The gate 107 may include a silicide or the like that has a lower resistance than polycrystalline Si.

In the example, the gate 107 and the insulating layer 105 are covered with the insulating film 108. The insulating film 108 is, for example, $SiO_2$, $Si_3N_4$, etc. To planarize the surface when forming the wiring layer 110, an organic insulating film such as PSG (Phosphorus Silicon Glass), BPSG (Boron Phosphorus Silicon Glass), etc., also may be provided.

The vias 111s and 111d are formed in the insulating film 108. The first wiring layer (the first wiring layer) 110 is formed on the insulating film 108. The first wiring layer 110 includes multiple wiring portions that may have different potentials, and includes wiring portions 110s and 110d.

In FIG. 1 and subsequent cross-sectional views, the reference numeral of each wiring layer is displayed at a position beside one wiring portion included in the wiring layer to be marked with the reference numeral. The vias 111s and 111d are located respectively between the n-type semiconductor regions 104s and 104d and the wiring portion 110s and 110d of the wiring layer 110 and electrically connect these components. For example, the wiring layer 110 and the vias 111s and 111d are formed of a metal such as Al, Cu, etc. The wiring layer 110 and the vias 111s and 111d may include a refractory metal, etc.

Also, the inter-layer insulating film 112 is located on the insulating film 108 and the wiring layer 110 as a planarization film. The inter-layer insulating film (the insulating film) 112 is, for example, an organic insulating film of PSG, BPSG, etc. The inter-layer insulating film 112 also functions as a protective film at the circuit board 100 that protects the surface of the circuit board 100.

The second wiring layer (the second wiring layer) 130 is located on the inter-layer insulating film 112. The wiring layer 130 includes a first wiring portion 130a. For example, the first wiring portion (the part of the wiring portion) 130a is located at each subpixel, and in the example, is connected to the light-transmitting electrode 159a located on the first wiring portion 130a and a power supply line 3 shown in FIG. 4 described below. The light-emitting element 150 is located on the first wiring portion 130a.

The wiring layer 130 that includes the first wiring portion 130a is formed of a material that has a high conductivity. The wiring layer 130 includes, for example, Ti, Al, an alloy of Ti and Sn, etc. Cu, V, or the like, or a highly-light-reflective noble metal such as Ag, Pt, etc., may be included. Because the wiring layer 130 is formed of such a metal material that has a high conductivity, etc., the light-emitting element 150 and the circuit 101 can be electrically connected with a low resistance.

When projected onto the XY plane, the outer perimeter of the light-emitting element 150 when projected from above along the Z-axis is located within the outer perimeter of the first wiring portion 130a. Thereby, the first wiring portion 130a can shield scattered light by reflecting the downward-scattered light of the light-emitting element 150 toward the light-emitting surface 151S side.

By appropriately selecting the material of the first wiring portion 130a, the luminous efficiency can be increased by reflecting the downward-scattered light of the light-emitting element 150 toward the light-emitting surface 151S side. Also, by the first wiring portion 130a shielding the downward-scattered light of the light-emitting element 150, the light can be prevented from reaching the transistor 103, and malfunction of the transistor 103 also can be prevented.

The light-emitting element 150 includes a p-type semiconductor layer (a first semiconductor layer) 153, a light-emitting layer 152, and an n-type semiconductor layer (a second semiconductor layer) 151. The p-type semiconductor layer 153, the light-emitting layer 152, and the n-type semiconductor layer 151 are stacked in this order from the inter-layer insulating film 112 toward the positive direction of the Z-axis. That is, the layers of the light-emitting element 150 are stacked from the inter-layer insulating film 112 side toward the light-emitting surface 151S side.

Although the light-emitting element 150 has, for example, a substantially square or rectangular shape when projected onto the XY plane, the corners may be rounded. The light-emitting element 150 may have, for example, an elliptical shape or a circular shape when projected onto the XY plane. The degree of freedom of the layout is increased by appropriately selecting the shape, arrangement, and the like of the light-emitting element in a plan view.

It is favorable for the light-emitting element 150 to include, for example, a nitride semiconductor such as $In_XAl_YGa_{1-X-Y}N$ ($0 \leq X$, $0 \leq Y$, and $X+Y<1$), etc. The light-emitting element 150 according to one embodiment of the invention is a so-called blue light-emitting diode, and the wavelength of the light emitted by the light-emitting element 150 is, for example, about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above, and can be set to an appropriate value.

The insulating member 156 covers a portion of the inter-layer insulating film 112, a portion of the second wiring layer 130, and at least the side surface of the light-emitting element 150. For example, the insulating member 156 is formed of a light-transmissive organic insulating material, etc. It is favorable for the insulating member 156 to be transparent. The insulating member 156 has a sufficiently large refractive index compared to the refractive index of the adhesive layer 170 covering the insulating member 156.

As the material of the insulating member 156, for example, a sulfur (S)-including substituent, a high polymer material including a phosphorus (P) atom-including group, a high refractive index nanocomposite material in which inorganic nanoparticles that have a high refractive index are introduced to a polymer matrix of polyimide, etc., are well-known; however, the material of the insulating member 156 is not limited thereto. Also, as the material of the adhesive layer 170, for example, hollow nanoparticles, an organic material in which porous nanoparticles are dispersed, etc., are well-known; however, as expected, the material of the adhesive layer 170 is not limited thereto; applications also are possible in which a space is located at the vicinity of the insulating member 156, etc.

The insulating member 156 includes a convex surface that is convex toward the light-emitting surface 151S side. The insulating member 156 is an insulating member that functions as a convex lens that causes the light radiated from the side surface of the light-emitting element 150 to have the light distribution toward the light-emitting surface 151S side.

Figure 2:
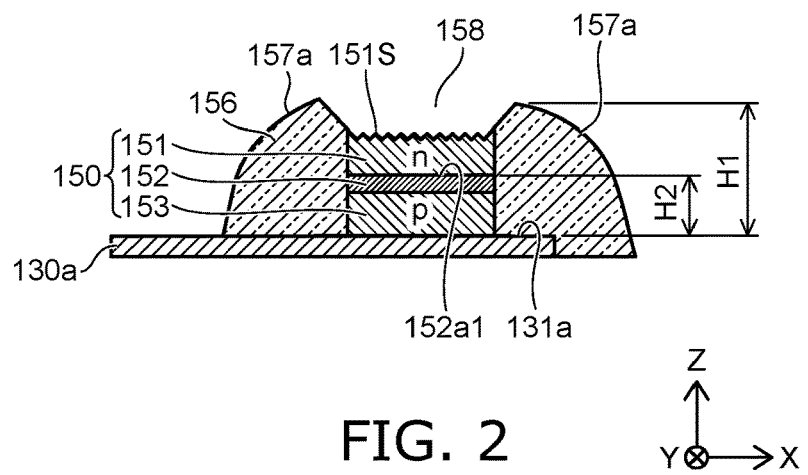
FIG. 2 is a schematic cross-sectional view illustrating a portion of the image display device of the first embodiment.

FIG. 2 is a schematic cross-sectional view illustrating a portion of the image display device of the embodiment.

FIG. 2 is a schematic view for describing the function of the insulating member 156. The positional relationship of the first wiring portion 130a, the light-emitting element 150, and the insulating member 156 of the cross-sectional view of FIG. 1 is shown in detail in FIG. 2.

As shown in FIG. 2, the light-emitting element 150 includes the p-type semiconductor layer 153, the light-emitting layer 152, and the n-type semiconductor layer 151 stacked in this order toward the positive direction of the Z-axis. The p-type semiconductor layer 153 is placed on a first surface 131a on the first wiring portion 130a. Here, the first surface 131a is a plane that is substantially parallel to the XY plane. The light-emitting surface 151S is exposed in an opening 158 of the insulating member 156 and is provided to be substantially parallel to the first surface 131a.

The insulating member 156 covers the side surface of the light-emitting element 150. The insulating member 156 includes a surface 157a that is convex from the first wiring portion 130a side toward the light-emitting surface 151S side.

The light-emitting layer 152 is exposed at the side surface of the light-emitting element 150. The light-emitting layer 152 that is excited by the injection of electrons and holes radiates light also from the side surface. The light that is radiated from the side surface of the light-emitting layer 152 includes radiated light that has a component parallel to the XY plane. The radiated light that has the component parallel to the XY plane is emitted from the surface 157a. The shape of the surface 157a can be set so that the radiated light emitted from the surface 157a of the insulating member 156 has a light distribution toward the light-emitting surface 151S side.

Favorably, a height H1 (a first height) of the insulating member 156 is set to a sufficiently higher position than a height H2 (a second height) of a surface 152a1 (a second surface) of the light-emitting layer 152. By such a setting, the radiated light that has the component parallel to the XY plane is caused to have a light distribution toward the light-emitting surface 151S side. The height H1 is the height to the highest position of the insulating member 156 from the first surface 131a. The surface 152a1 of the light-emitting layer 152 at the height H2 is the surface at the side at which the n-type semiconductor layer 151 is located.

FIGS. 3A to 3D are schematic views for describing a lens function of the insulating member according to the embodiment.

Figure 3A:
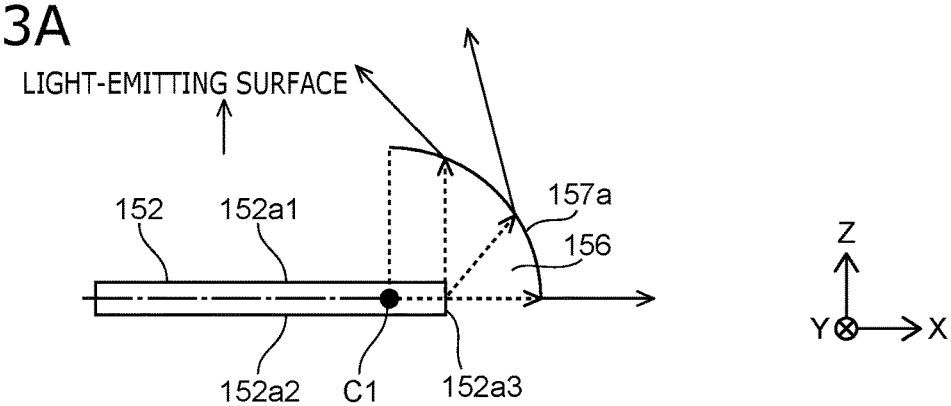
FIG. 3A is a schematic view for describing a lens function of an insulating member according to the first embodiment.
Figure 3B:
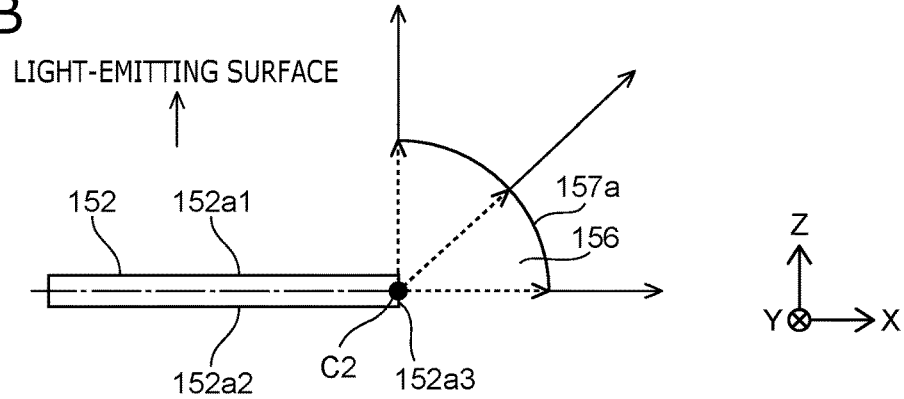
FIG. 3B is a schematic view for describing a lens function of the insulating member according to the first embodiment.
Figure 3C:
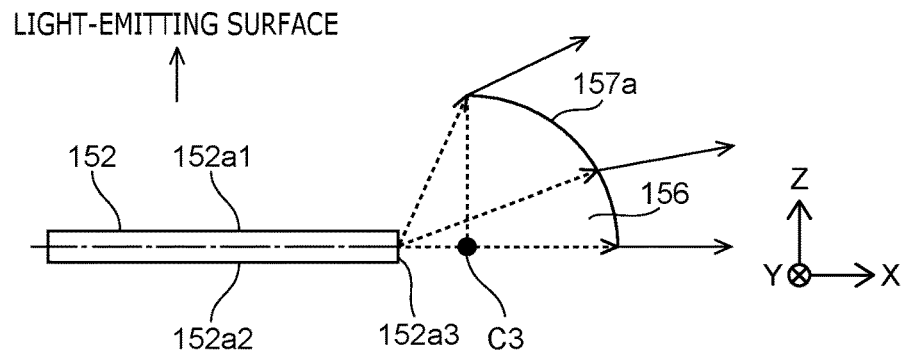
FIG. 3C is a schematic view for describing a lens function of the insulating member according to the first embodiment.
Figure 3D:
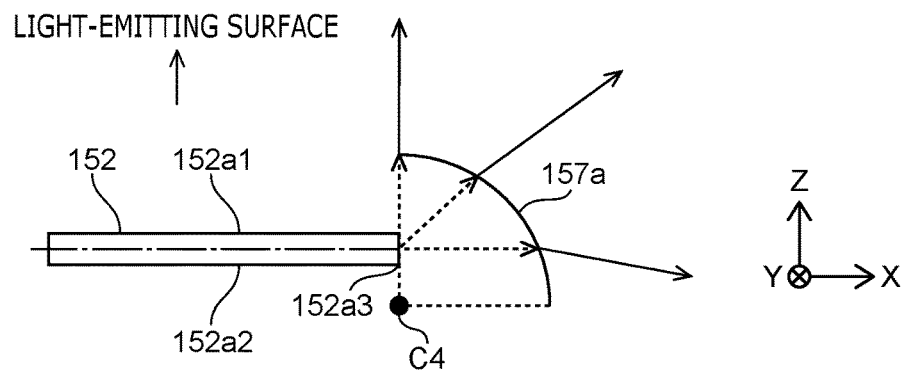
FIG. 3D is a schematic view for describing a lens function of the insulating member according to the first embodiment.

Details of the positional relationship between the light-emitting layer 152 and the surface 157a are shown in FIGS. 3A to 3D. In such a case, the surface 157a is a portion of a spherical surface. C1 to C4 show the center of the spherical surface formed by the surface 157a. In the examples of FIGS. 3A to 3C, the centers C1 to C3 are positioned at ½ of the length in the Z-axis direction of the light-emitting layer 152. That is, the centers C1 to C3 are positioned at ½ of the distance between the one surface 152a1 and another surface 152a2 of the light-emitting layer 152. In the example of FIG. 3D, the center C4 is at a position that is shifted further toward the negative-direction side of the Z-axis than the position at ½ of the length in the Z-axis direction of the light-emitting layer 152.

The light-emitting layer 152 includes an end portion 152a3, and the end portion 152a3 is included in the side surface of the light-emitting layer 152. The one surface 152a1 is the surface on which the n-type semiconductor layer 151 is stacked, and the other surface 152a2 is the surface on which the p-type semiconductor layer 153 is stacked.

The light-emitting layer 152 is taken to be a rectangle that includes sides respectively parallel to the X-axis and the Y-axis when projected onto the XY plane. The centers C1 to C4 are taken to be on a straight line parallel to the X-axis passing through a position at ½ of a side of the light-emitting layer 152 parallel to the Y-axis. Also, the refractive index inward of the surface 157a is taken to be greater than the refractive index outward of the surface 157a.

When the center C1 is inside the light-emitting layer 152 and at a position of ½ of the length in the Z-axis direction of the light-emitting layer 152 as shown in FIG. 3A, the light that is radiated from the end portion 152a3 other than the light parallel to the X-axis is refracted by the surface 157a in the direction of the light-emitting surface.

When the center C2 exists in the end portion 152a3 of the light-emitting layer 152 and is at the position of ½ of the length in the Z-axis direction of the light-emitting layer 152 as shown in FIG. 3B, substantially all of the light that is radiated from the end portion 152a3 is incident on the surface 157a at substantially 90°; therefore, the light is substantially not refracted, and is radiated from the surface 157a at the angle of the radiated light from the end portion 152a3.

When the center C3 is outside the light-emitting layer 152 and is at the position of ½ of the length in the Z-axis direction of the light-emitting layer 152 as shown in FIG. 3C, the light that is radiated from the end portion 152a3 other than the light parallel to the Y-axis is refracted by the surface 157a in directions orthogonal to the light-emitting surface. Therefore, the light that has a light distribution in the light-emitting surface direction is suppressed.

When the center C4 is on a line parallel to the Z-axis of the end portion 152a3 of the light-emitting layer 152 and is at a position shifted in the negative direction of the Z-axis from the Z-axis direction center of the light-emitting layer 152 as shown in FIG. 3D, the light other than the light parallel to the Y-axis is refracted by the surface 157a in directions orthogonal to the light-emitting surface. Therefore, the light that has a light distribution in the light-emitting surface direction is suppressed.

The description above is an example; the shape of the surface 157a of the insulating member 156 can be appropriately set to cause the light radiated from the side surface of the light-emitting layer 152 to have a light distribution in the normal direction perpendicular to the light-emitting surface 151S. Also, the insulating member 156 can be used as a more appropriate light distribution control part by setting the refractive indexes by appropriately selecting the material of the insulating member 156 and the material of the adhesive layer 170 covering the insulating member 156.

The description continues now by returning to FIG. 1.

The insulating member 156 includes the opening 158. The opening 158 is formed by removing a portion of the insulating member 156 above the light-emitting element 150. The opening 158 is formed so that the light-emitting surface 151S is exposed from the insulating member 156. The light-emitting surface 151S is the surface of the n-type semiconductor layer 151 that is opposite to the surface contacting the light-emitting layer 152.

It is favorable to perform surface roughening of the light-emitting surface 151S. When the light-emitting surface 151S is a rough surface, the light extraction efficiency of the light-emitting element 150 can be increased. When the light-emitting surface 151S is not roughened, the process of performing the surface roughening can be omitted.

An opening 113 of the inter-layer insulating film 112 is provided in the inter-layer insulating film 112. A portion of a surface of a wiring portion 110d that is connected to the drain electrode of the transistor 103 is exposed through the opening 113. The opening 113 is formed in the inter-layer insulating film 112 to electrically connect the first semiconductor layer 151 and the wiring portion 110s.

The light-transmitting electrode 159k is located over the roughened light-emitting surface 151S and is electrically connected to the n-type semiconductor layer 151. The light-transmitting electrode 159k is provided to extend onto the insulating member 156, the exposed surface of the wiring portion 110d, and the inter-layer insulating film 112. Accordingly, the n-type semiconductor layer 151 and the wiring portion 110d are electrically connected by the light-transmitting electrode 159k.

Figure 4:
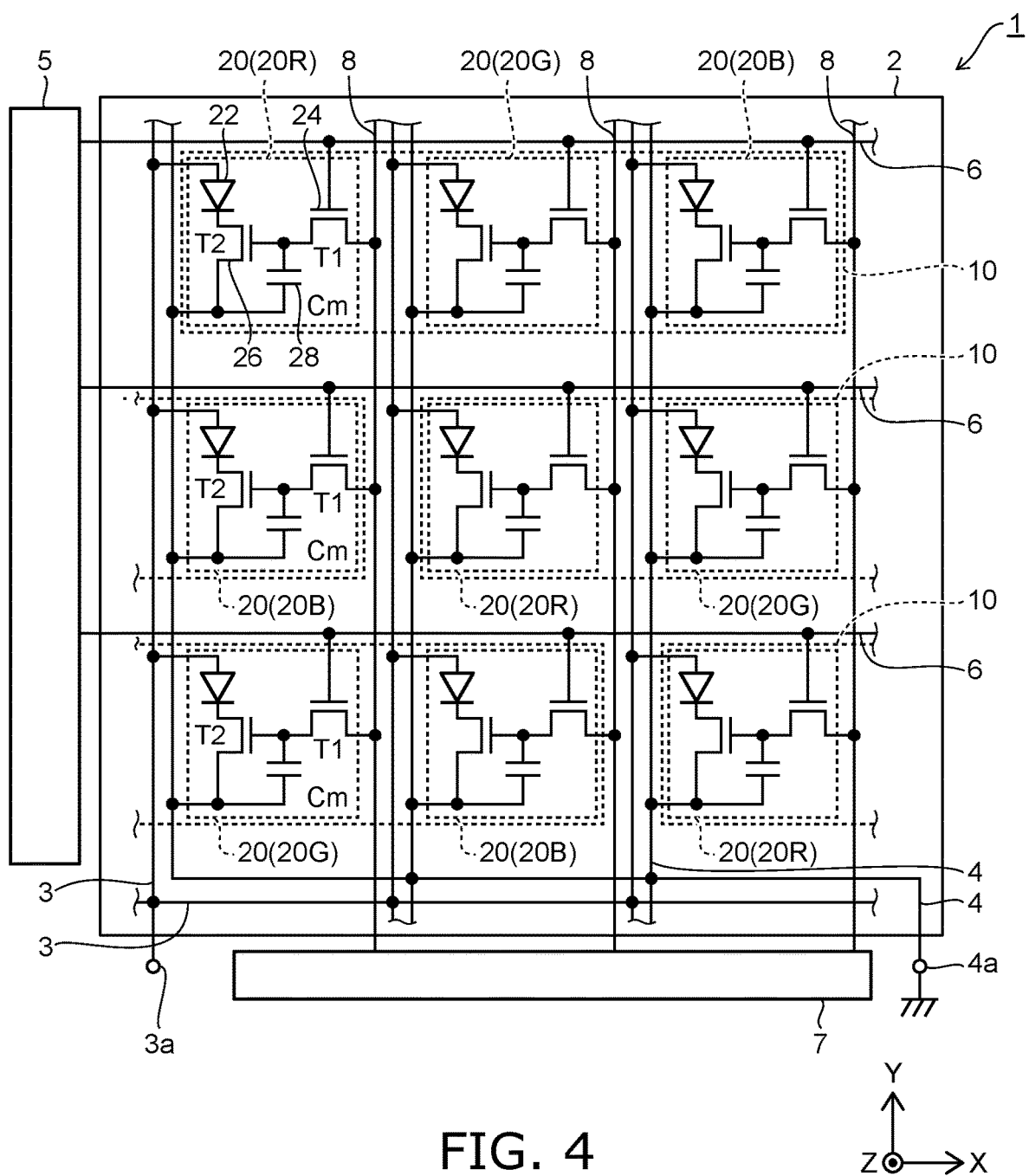
FIG. 4 is a schematic block diagram illustrating the image display device of the first embodiment.

The light-transmitting electrode 159a is located on the first wiring portion 130a and is electrically connected to the first wiring portion 130a. In the example as shown in FIG. 4 described below, the light-transmitting electrode 159a and the first wiring portion 130a are connected to the power supply line 3. Accordingly, the p-type semiconductor layer 153 is electrically connected to the power supply line 3 by the light-transmitting electrode 159a and the first wiring portion 130a.

The light-transmitting electrode 159 is located also on other wiring portions of the second wiring layer 130. The light-transmitting electrodes 159, 159a, and 159k (a third wiring layer) are formed of light-transmissive conductive films of ITO (indium tin oxide), etc.

The adhesive layer 170 covers the insulating member 156, the light-transmitting electrodes 159, 159a, and 159k, and the inter-layer insulating film 112. The adhesive layer 170 is a substantially transparent resin adhesive and is provided to protect the insulating member 156, the light-transmitting electrodes 159, 159a, and 159k, etc., and to bond the color filter 180.

The color filter 180 includes a light-shielding part 181 and a color conversion part 182. The color conversion part 182 is located substantially directly above the insulating member 156 that is formed in a convex lens shape to correspond to the shape of the light distribution due to the insulating member 156 when projected onto the XY plane.

The color conversion part 182 is one layer or two layers. A two-layer part is shown in FIG. 1. Whether the color conversion part 182 is one layer or whether the color conversion part 182 is two layers is determined by the color, i.e., the wavelength, of the light emitted by the subpixel 20. When the light emission color of the subpixel 20 is red or green, it is favorable for the color conversion part 182 to be two layers. When the light emission color of the subpixel 20 is blue, it is favorable to be one layer.

When the color conversion part 182 is two layers, the first layer that is more proximate to the light-emitting element 150 is a color conversion layer 183, and the second layer is a filter layer 184. That is, the filter layer 184 is stacked on the color conversion layer 183.

The color conversion layer 183 is a layer that converts the wavelength of the light emitted by the light-emitting element 150 into the desired wavelength. When the subpixel 20 emits red, light of the wavelength of the light-emitting element 150, i.e., 467 nm±20 nm, is converted into, for example, light of a wavelength of about 630 nm±20 nm. When the subpixel 20 emits green, light of the wavelength of the light-emitting element 150, i.e., 467 nm±20 nm, is converted into, for example, light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without having passed through the color conversion layer 183. When the wavelength of the light emitted by the light-emitting element 150 is about 467 nm±20 nm, the subpixel 20 may output the light without having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 in the blue subpixel 20, a micro external light reflection that occurs at the surface of the light-emitting element 150 is suppressed.

In the color filter 180, the part other than the color conversion part 182 is the light-shielding part 181. The light-shielding part 181 is a so-called black matrix that reduces blur due to color mixing of the light emitted from adjacent color conversion parts 182, etc., and makes it possible to display a sharp image.

FIG. 4 is a schematic block diagram illustrating the image display device according to the embodiment.

As shown in FIG. 4, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as in the example. In the pixels 10, subpixels of the same color may be arranged in the same column, or subpixels of different colors may be arranged in each column as in the example.

The image display device 1 further includes the power supply line 3 and a ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a direct current power supply connected between a power supply terminal 3a and a GND terminal 4a. The power supply terminal 3a and the GND terminal 4a are provided respectively at end portions of the power supply line 3 and the ground line 4, and are connected to a direct current power supply circuit located outside the display region 2. A positive voltage when referenced to the GND terminal 4a is supplied to the power supply terminal 3a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction at the outer edge of the display region 2. The row selection circuit 5 is electrically connected to the subpixel 20 of each column via the scanning line 6, and supplies a select signal to each subpixel 20.

The signal voltage output circuit 7 is located along the outer edge of the display region 2. The signal voltage output circuit 7 is located along the X-axis direction at the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 4, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel MOSFET, and a cathode electrode that is an n-electrode of the light-emitting element 22 is connected to a drain electrode that is a major electrode of the drive transistor 26. The series circuit of the light-emitting element 22 and the drive transistor 26 is connected between the power supply line 3 and the ground line 4. The drive transistor 26 corresponds to the transistor 103 of FIG. 1, etc., and the light-emitting element 22 corresponds to the light-emitting element 150 of FIG. 1, etc. The current that flows in the light-emitting element 22 is determined by the voltage that is applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a major electrode. The gate electrode of the select transistor 24 is connected to the scanning line 6. The capacitor 28 is connected between the ground line 4 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current flowing in the light-emitting element 22.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

A method for manufacturing the image display device 1 of the embodiment will now be described.

FIGS. 5A to 8C are schematic cross-sectional views illustrating the method for manufacturing the image display device of the embodiment and modifications of the manufacturing method.

Figure 5A:
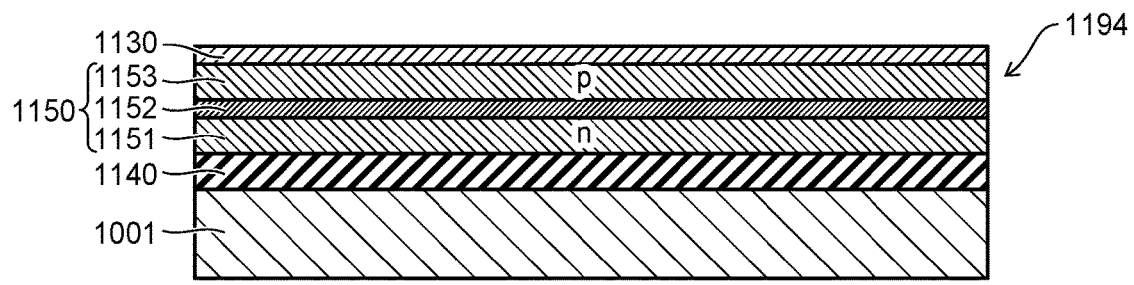
FIG. 5A is a schematic cross-sectional view illustrating a method for manufacturing the image display device of the first embodiment.

According to the method for manufacturing the image display device of the embodiment as shown in FIG. 5A, a semiconductor growth substrate (a second substrate) 1194 is prepared. The semiconductor growth substrate 1194 includes a semiconductor layer 1150 that is grown on a crystal growth substrate (a first substrate) 1001. The crystal growth substrate 1001 is, for example, a Si substrate, a sapphire substrate, etc. It is favorable to use a Si substrate.

In the example, a buffer layer 1140 is formed at one surface of the crystal growth substrate 1001. It is favorable for the buffer layer (the buffer layer) 1140 to include a nitride such as AlN, etc. The buffer layer 1140 is used to relax the mismatch at the interface between the GaN crystal and the crystal growth substrate 1001 when epitaxially growing GaN.

In the semiconductor growth substrate 1194, an n-type semiconductor layer 1151, a light-emitting layer 1152, and a p-type semiconductor layer 1153 are stacked on the buffer layer 1140 in this order from the buffer layer 1140 side. For example, vapor deposition (Chemical Vapor Deposition, CVD) is used to grow the semiconductor layer 1150, and it is favorable to use metal-organic chemical vapor deposition (Metal Organic Chemical Vapor Deposition, MOCVD). The semiconductor layer 1150 is, for example, $In_XAl_YGa_{1-X-Y}N$ ($0 \leq X$, $0 \leq Y$, and $X+Y<1$), etc.

In the initial state of the crystal growth, crystal defects that are caused by mismatch of the crystal lattice constants occur easily, and such a crystal is of the n-type. Therefore, as in the example, it is advantageous to stack from the n-type semiconductor layer 1151 on the crystal growth substrate 1001 because the margin of the production processes is increased, and the yield is easily increased.

A metal layer 1130 is formed at the surface of the p-type semiconductor layer 1153 at the side that is opposite to the surface at the side at which the light-emitting layer 1152 is located. The metal layer 1130 includes, for example, Ti, Al, an alloy of Ti and Sn, etc. Cu, V, or the like, or a highly-light-reflective noble metal such as Ag, Pt, etc., may be included.

It is advantageous when the metal layer 1130 is formed on the surface of the p-type semiconductor layer 1153 because the p-type semiconductor layer 1153 can be protected by the metal layer 1130, and the storage of the semiconductor growth substrate 1194 is easier. It is also possible to further reduce the drive voltage of the light-emitting element 150 described above by forming a thin film layer that includes a hole-injection material at the interface between the p-type semiconductor layer 1153 and the metal layer 1130. For example, an ITO film, etc., may be favorably used as such a hole-injection material.

Figure 5B:
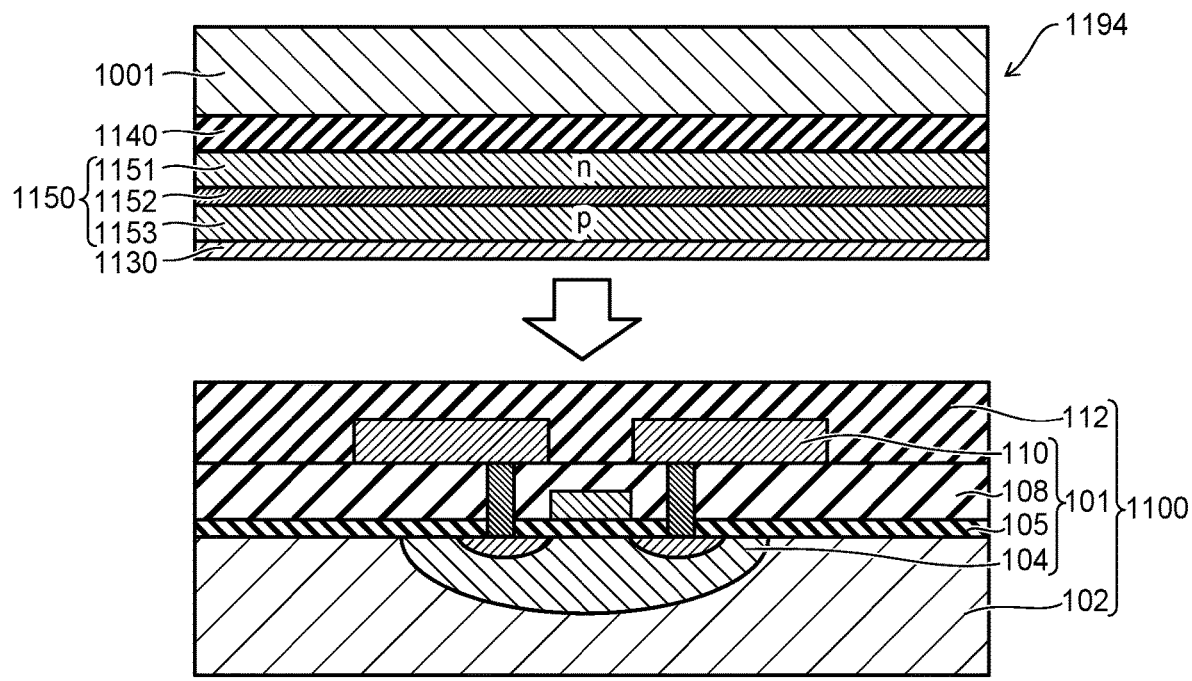
FIG. 5B is a schematic cross-sectional view illustrating the method for manufacturing the image display device of the first embodiment.

A circuit board 1100 is prepared as shown in FIG. 5B. A circuit board (a third substrate) 1100 includes the circuit 101 described in FIG. 1, etc. The semiconductor growth substrate 1194 is vertically inverted, and is bonded with the circuit board 1100. More specifically, as shown by the arrow of the drawing, the exposed surface of the inter-layer insulating film 112 formed in the circuit board 1100 and the surface of the metal layer 1130 formed on the semiconductor layer 1150 are caused to face each other, and the two are bonded. Subsequently, the crystal growth substrate 1001 is removed. For example, wet etching and/or laser lift-off is used to remove the crystal growth substrate 1001.

In the wafer bonding that bonds the two substrates, for example, the two substrates are heated, and the two substrates are bonded by thermal compression bonding. A low melting-point metal and/or a low melting-point alloy may be used when performing thermal compression bonding. The low melting-point metal is, for example, Sn, In, etc.; the low melting-point alloy can be, for example, an alloy having Zn, In, Ga, Sn, Bi, etc., as a major component.

In the wafer bonding, other than the description above, the bonding surfaces of the substrates may be cleaned by plasma processing in a vacuum and closely adhered after planarizing the bonding surfaces using chemical mechanical polishing (Chemical Mechanical Polishing, CMP), etc.

Modifications relating to the wafer bonding process are shown in FIGS. 6A to 7B. In the wafer bonding process, the processes of FIGS. 6A to 6C can be used instead of the processes of FIGS. 5A and 5B. Also, one process of FIG. 7A or FIG. 7B may be used instead of the processes of FIGS. 5A and 5B.

Figure 6A:
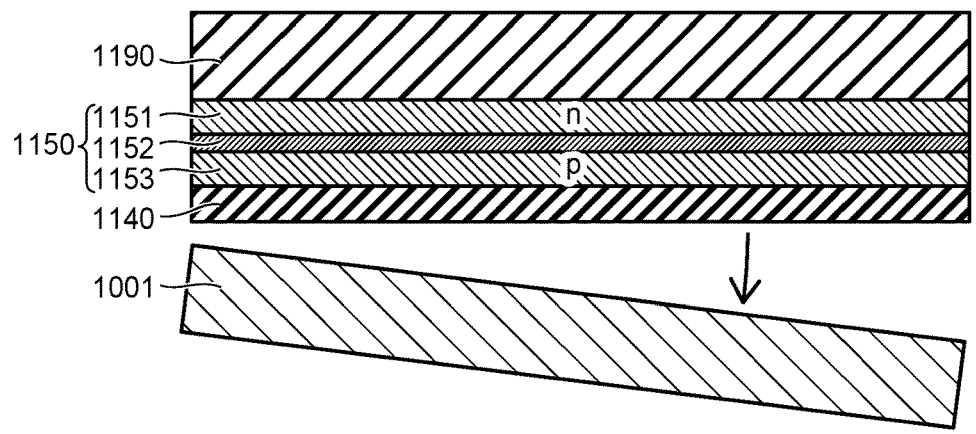
FIG. 6A is a schematic cross-sectional view illustrating a modification of the method for manufacturing the image display device of the first embodiment.
Figure 6B:
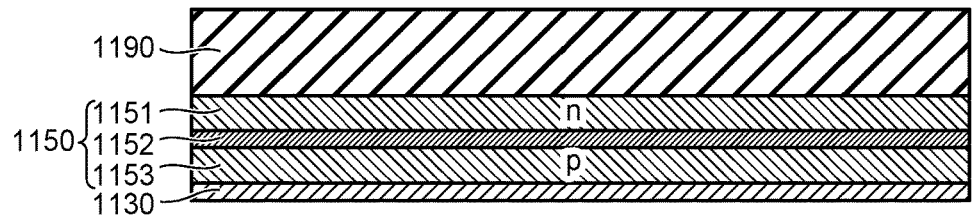
FIG. 6B is a schematic cross-sectional view illustrating the modification of the method for manufacturing the image display device of the first embodiment.
Figure 6C:
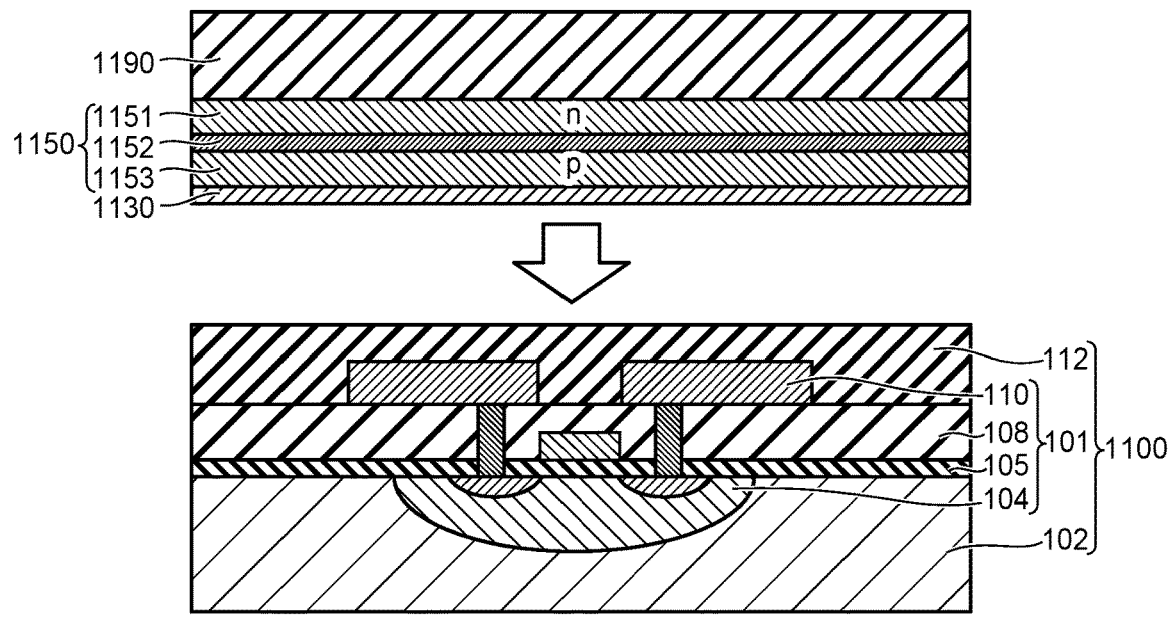
FIG. 6C is a schematic cross-sectional view illustrating the modification of the method for manufacturing the image display device of the first embodiment.

In FIGS. 6A to 6C, after the semiconductor layer 1150 is formed on the crystal growth substrate 1001, the semiconductor layer 1150 is transferred to a support substrate 1190 that is different from the crystal growth substrate 1001. The semiconductor layer 1150 in which the p-type semiconductor layer 1153, the light-emitting layer 1152, and the n-type semiconductor layer 1151 grown in this order on the crystal growth substrate 1001 from the crystal growth substrate 1001 side with the buffer layer 1140 interposed.

As shown in FIG. 6A, after the semiconductor layer 1150 is formed, the support substrate 1190 is bonded to the surface of the n-type semiconductor layer 1151 opposite to the surface at the side at which the light-emitting layer 1152 is located, i.e., the surface at which the n-type semiconductor layer 1151 is not covered, for example, the support substrate 1190 is formed of Si, quartz, etc. Subsequently, the crystal growth substrate 1001 is removed. For example, laser lift-off is used to remove the crystal growth substrate 1001.

As shown in FIG. 6B, the buffer layer 1140 is removed by wet etching, etc. The metal layer 1130 is formed on the surface of the p-type semiconductor layer 1153 that is not covered by removing the buffer layer 1140.

As shown in FIG. 6C, the semiconductor layer 1150 is bonded with the circuit board 1100 via the metal layer 1130. Subsequently, the support substrate 1190 is removed by laser lift-off, etc.

In another modification, the semiconductor growth substrate 1194 in which the metal layer 1130 is formed is prepared as previously shown in FIG. 5A.

Figure 7A:
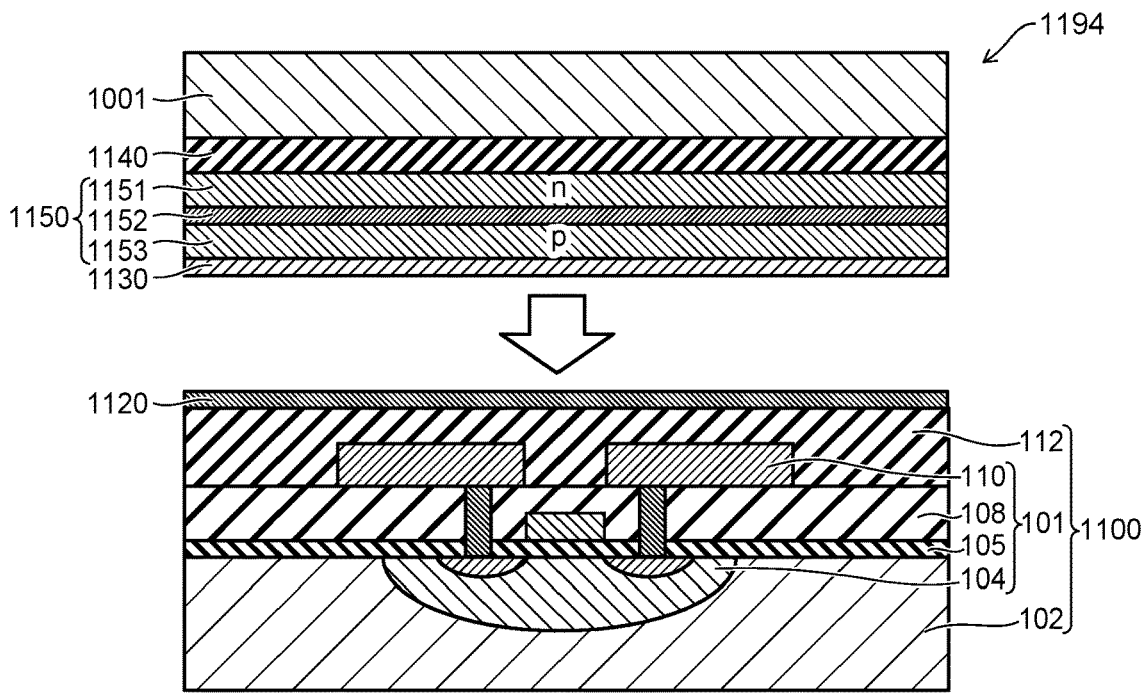
FIG. 7A is a schematic cross-sectional view illustrating a modification of the method for manufacturing the image display device of the first embodiment.

As shown in FIG. 7A, a metal layer 1120 is pre-formed on the inter-layer insulating film 112 of the circuit board 1100. It is favorable for the metal layer 1120 to include the same metal material as the metal layer 1130 located in the semiconductor growth substrate 1194. The metal layer 1130 that is formed in the semiconductor layer 1150 and the metal layer 1120 that is formed on the circuit board 1100 are bonded to each other.

It is sufficient for a metal layer to be located in at least one of the semiconductor growth substrate 1194 or the circuit board 1100. When the metal layer 1120 is formed at the circuit board 1100 side, the semiconductor layer 1150 and the circuit board 1100 may be bonded to each other via the metal layer 1120 without providing the metal layer 1130 in the semiconductor growth substrate 1194.

Figure 7B:
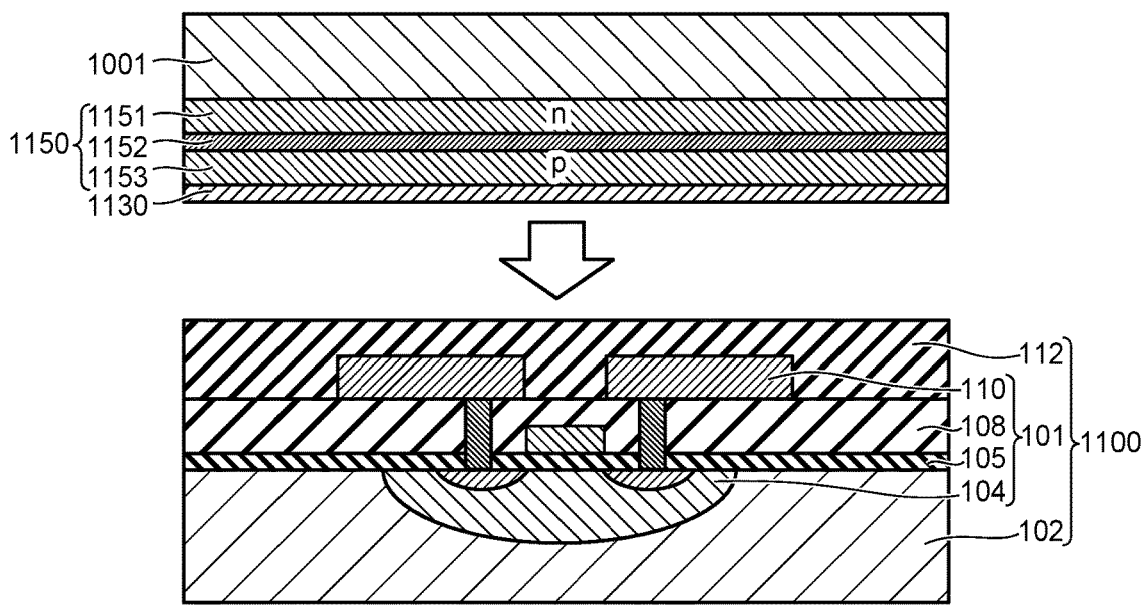
FIG. 7B is a schematic cross-sectional view illustrating a modification of the method for manufacturing the image display device of the first embodiment.

In another modification as shown in FIG. 7B, the semiconductor layer 1150 is formed on the crystal growth substrate 1001 without interposing a buffer layer. The n-type semiconductor layer 1151, the light-emitting layer 1152, and the p-type semiconductor layer 1153 are grown on the crystal growth substrate 1001 in this order from the crystal growth substrate 1001 side. In such a case, the process of removing the buffer layer after the wafer bonding can be omitted.

The description continues now by returning to the manufacturing process after the wafer bonding.

Figure 8A:
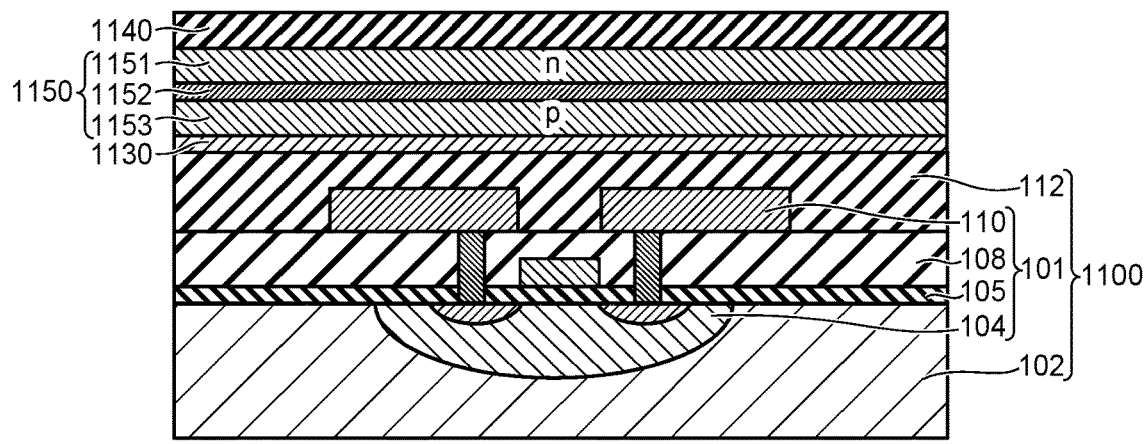
FIG. 8A is a schematic cross-sectional view illustrating the method for manufacturing the image display device of the first embodiment.

As shown in FIG. 8A, after the circuit board 1100 is bonded to the semiconductor layer 1150 via the metal layer 1130 by wafer bonding, the crystal growth substrate 1001 is removed by wet etching, laser lift, etc.

Figure 8B:
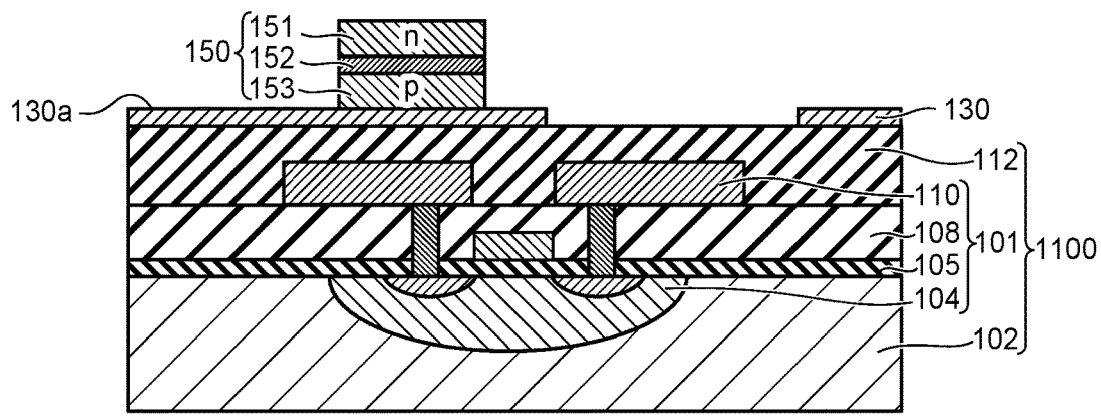
FIG. 8B is a schematic cross-sectional view illustrating the method for manufacturing the image display device of the first embodiment.

As shown in FIG. 8B, after removing the buffer layer 1140 by wet etching, dry etching, etc., the metal layer 1130 and the semiconductor layer 1150 are formed in the necessary shape by etching.

The semiconductor layer 1150 is formed in the shape of the light-emitting element 150. To form the light-emitting element 150, for example, a dry etching process is used, and favorably anisotropic plasma etching (Reactive Ion Etching, RIE) is used. Subsequently, the second wiring layer 130 is formed by etching the metal layer 1130. The wiring layer 130 includes the first wiring portion 130a. The first wiring portion 130a is formed in the desired shape described above by etching.

Figure 8C:
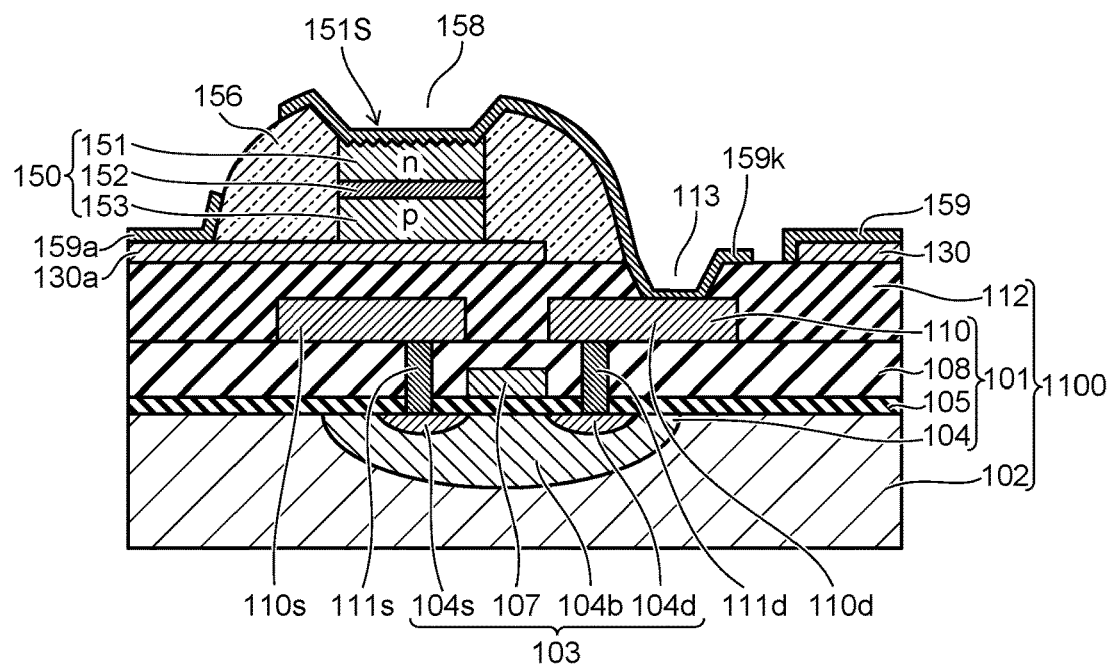
FIG. 8C is a schematic cross-sectional view illustrating the method for manufacturing the image display device of the first embodiment.

As shown in FIG. 8C, the opening 113 is formed in the inter-layer insulating film 112. Wet etching or dry etching may be used to form the opening 113. The etching is performed until the wiring portion 110d is exposed.

Subsequently, the insulating member 156 is provided to cover a portion of the inter-layer insulating film 112, a portion of the first wiring portion 130a, and the light-emitting element 150. The insulating member 156 is formed to have a dome shape that is convex from the first wiring portion 130a toward the light-emitting surface 151S. A portion of the insulating member 156 at the position of the light-emitting element 150 when projected onto the XY plane is removed. The light-emitting surface 151S is exposed in the opening 158 at which the insulating member 156 is removed.

The light-transmitting electrode 159k is formed over the light-emitting surface 151S at which the insulating member 156 is removed. The light-transmitting electrode 159k is formed to extend onto the insulating member 156 to cover the wiring portion 110d exposed in the opening 113. The light-transmitting electrode 159a is formed on the first wiring portion 130a simultaneously with the formation of the light-transmitting electrode 159k. The light-transmitting electrode 159 is located also on the other wiring portions.

A portion of the circuit other than the subpixel 20 is formed in the circuit board 1100. For example, the row selection circuit 5 shown in FIG. 4 can be formed in the circuit board 1100 together with drive transistors, select transistors, etc. That is, there are cases where the row selection circuit 5 is simultaneously embedded by the manufacturing processes described above. On the other hand, it is desirable for the signal voltage output circuit 7 to be embedded in a semiconductor device that is manufactured by manufacturing processes in which higher integration by fine patterning is possible. For example, the signal voltage output circuit 7 is mounted to another substrate together with a CPU and/or other circuit components, and is connected with the wiring portions of the circuit board 1100 before embedding the color filter described below or after embedding the color filter.

It is favorable for the circuit board 1100 to be a wafer that includes the circuit 101. The circuit 101 is formed in the circuit board 1100 for one or multiple image display devices. Or, in the case of a larger screen size, etc., the circuit 101 for configuring one image display device may be formed by being subdivided into multiple circuit boards 1100, and one image display device may be configured by combining all of the subdivided circuits.

Also, it is favorable for the crystal growth substrate 1001 to be a wafer of the same size as the wafer-shaped circuit board 1100.

Figure 9:
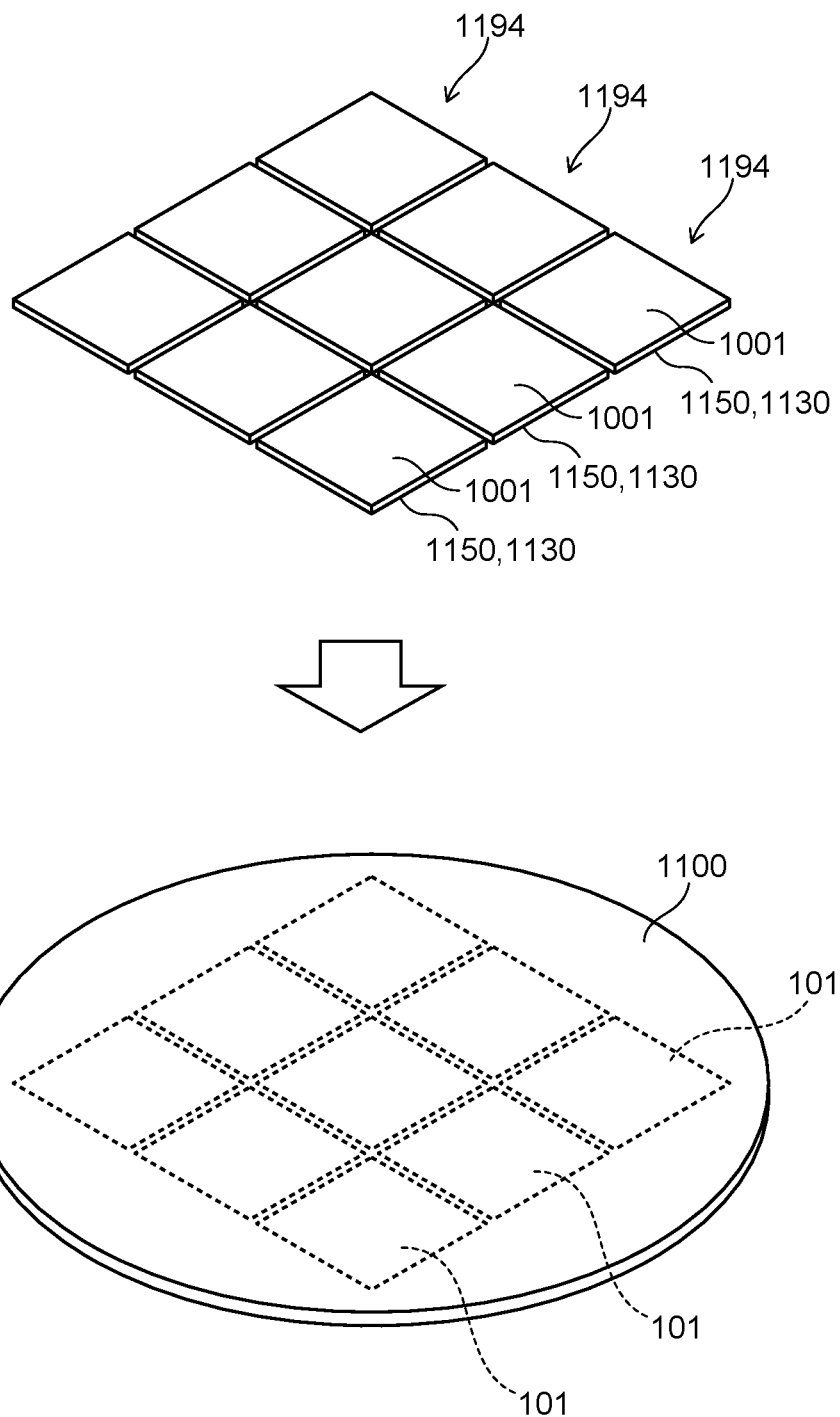
FIG. 9 is a schematic perspective view illustrating the method for manufacturing the image display device of the first embodiment.

FIG. 9 is a perspective view illustrating the method for manufacturing the image display device of the embodiment.

As shown in FIG. 9, multiple semiconductor growth substrates 1194 may be prepared, and semiconductor layers 1150 that are formed on the multiple crystal growth substrates 1001 may be bonded to one circuit board 1100. The metal layer 1130 is formed in the semiconductor layer 1150 of the semiconductor growth substrate 1194. Or, the metal layer 1120 may be formed on the inter-layer insulating film 112 of the circuit board 1100. The state of the bonding between the semiconductor growth substrate 1194 and the circuit board 1100 (100) is already described with reference to FIGS. 5A and 7A.

For example, the multiple circuits 101 are arranged in a lattice shape in the circuit board 1100. The circuits 101 include all of the subpixels 20, etc., necessary for one image display device 1. A spacing that is about the scribe line width is located between the circuits 101 that are located next to each other. A circuit element or the like is not located at the end portion or the end portion vicinity of the circuit 101.

The semiconductor layer 1150 is formed so that the end portion of the semiconductor layer 1150 is aligned with the end portion of the crystal growth substrate 1001. Therefore, by disposing and bonding so that the end portion of the semiconductor growth substrate 1194 is aligned with the end portion of the circuit 101, the end portion of the semiconductor layer 1150 and the end portion of the circuit 101 can be aligned after bonding.

When growing the semiconductor layer 1150 on the crystal growth substrate 1001, crystal quality easily degrades at the end portion and the end portion vicinity of the semiconductor layer 1150. Therefore, by aligning the end portion of the semiconductor layer 1150 and the end portion of the circuit 101, the region at which the crystal quality easily degrades that is at the end portion vicinity of the semiconductor layer 1150 on the semiconductor growth substrate 1194 is not used in the display region of the image display device 1.

Or, conversely, multiple circuit boards 1100 may be prepared, and the multiple circuit boards 1100 may be bonded to the semiconductor layer 1150 that is formed on the crystal growth substrate 1001 of one semiconductor growth substrate 1194. Or, at least here, it is important that the end portion of the crystal growth substrate 1001 does not overlap the light-emitting element 22 (150) of the image display device 1.

Figure 10:
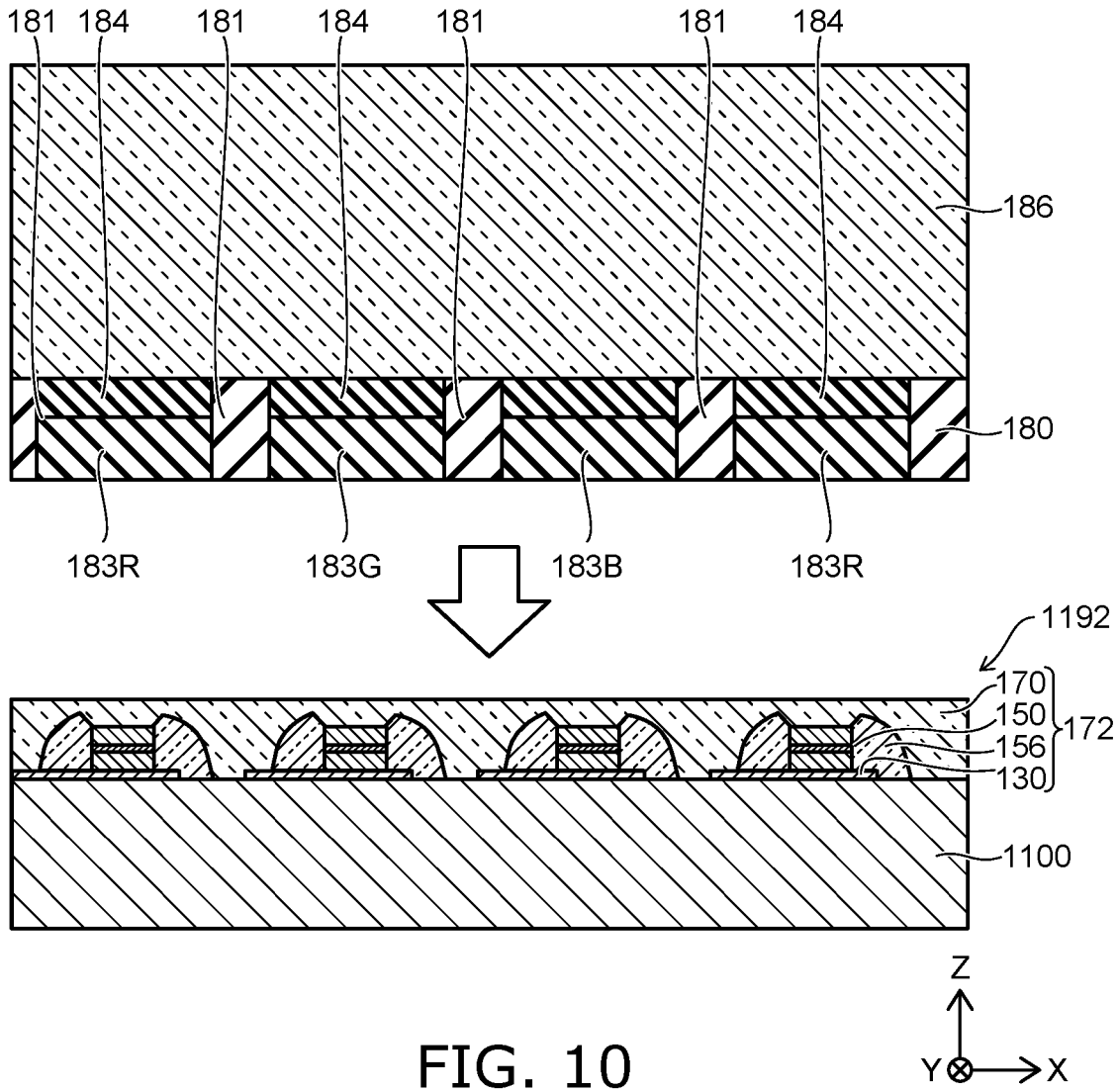
FIG. 10 is a schematic cross-sectional view illustrating the method for manufacturing the image display device of the first embodiment.

FIG. 10 is a schematic cross-sectional view illustrating the method for manufacturing the image display device of the embodiment.

In FIG. 10, the structure in the circuit board 1100, the inter-layer insulating film 112, the light-transmitting electrodes 159, 159*a*, and 159*k*, etc., are not illustrated to avoid complexity. Also, a portion of the color conversion members such as the color filter 180, etc., is displayed in FIG. 10. In FIG. 10, the structural component that includes the wiring layer 130, the light-emitting element 150, the adhesive layer 170, the not-illustrated light-transmitting electrodes 159, 159*k*, and 159*a*, etc., are called a light-emitting circuit part 172. Also, the structural component in which the light-emitting circuit part 172 is located on the circuit board 1100 is called due to a structure body 1192.

As shown in FIG. 10, the color filter (the wavelength conversion member) 180 is bonded to the structure body 1192 at one surface of the color filter 180. The other surface of the color filter 180 is bonded to a glass substrate 186. The color filter 180 is bonded to the light-emitting circuit part 172 via the adhesive layer 170.

In the color filter 180 of the example, the color conversion parts are arranged in the positive direction of the X-axis in the order of red, green, and blue. For red, a red color conversion layer 183R is located in the first layer. For green, a green color conversion layer 183G is located in the first layer, and the filter layers 184 are located in the second layer respectively for red and green. For blue, a single-layer color conversion layer 183B may be provided, and the filter layer 184 may be provided. The light-shielding part 181 is located between the color conversion parts.

The color filter 180 is adhered to the structure body 1192 so that the positions of the color conversion layers 183R, 183G, and 183B of each color match the positions of the light-emitting elements 150.

FIGS. 11A to 11D are schematic cross-sectional views showing a modification of the method for manufacturing the image display device of the embodiment.

A method in which the color filter is formed by inkjet is shown in FIGS. 11A to 11D.

Figure 11A:
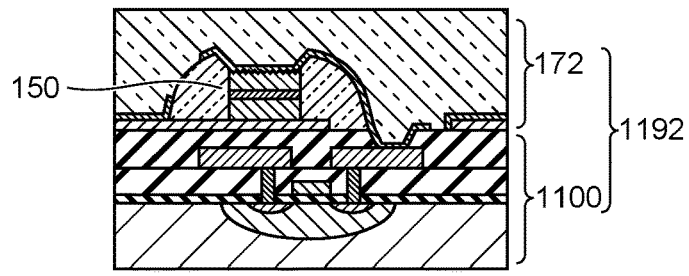
FIG. 11A is a schematic cross-sectional view illustrating the method for manufacturing the image display device of the first embodiment.

As shown in FIG. 11A, the structure body 1192 in which the light-emitting circuit part 172 is adhered to the circuit board 1100 is prepared.

Figure 11B:
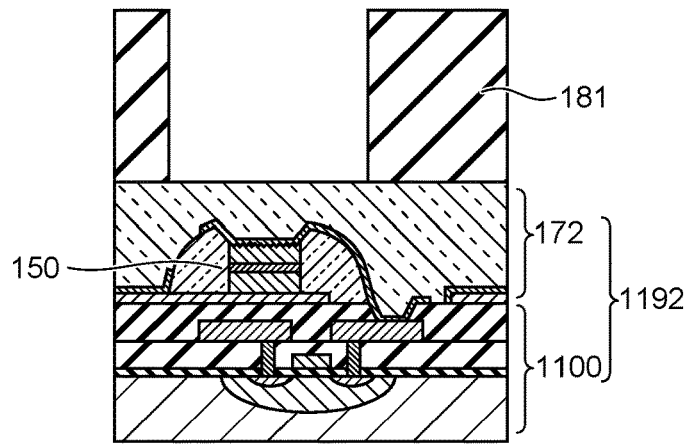
FIG. 11B is a schematic cross-sectional view illustrating the method for manufacturing the image display device of the first embodiment.

As shown in FIG. 11B, the light-shielding part 181 is formed on the structure body 1192. For example, the light-shielding part 181 is formed using screen printing, photolithography technology, etc.

Figure 11C:
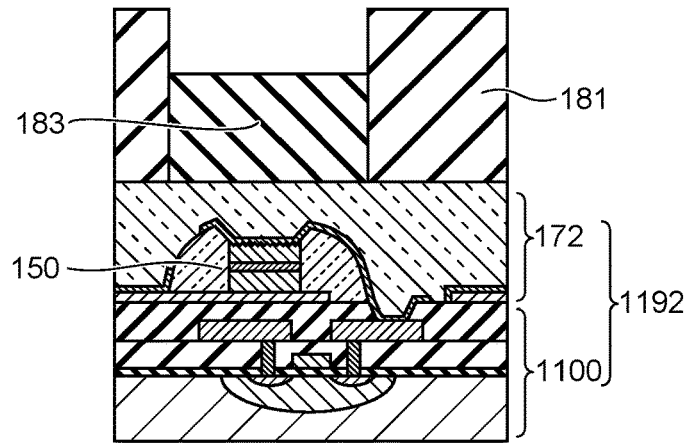
FIG. 11C is a schematic cross-sectional view illustrating the method for manufacturing the image display device of the first embodiment.

As shown in FIG. 11C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating material that uses a general fluorescer material or a quantum dot fluorescer material. It is favorable to use a quantum dot fluorescer material because the light emission colors can be realized, the monochromaticity can be high, and the color reproducibility can be high. After printing by the inkjet nozzle, drying processing is performed using an appropriate temperature and time. The thickness of the coating when coloring is set to be less than the thickness of the light-shielding part 181.

As described above, the fluorescer is not dispensed in the subpixel of the blue light emission when the color conversion part is not formed. Also, when the color conversion part may be one layer when forming the blue color conversion layer for the subpixel of the blue light emission, it is favorable for the thickness of the coating of the blue fluorescer to be about equal to the thickness of the light-shielding part 181.

Figure 11D:
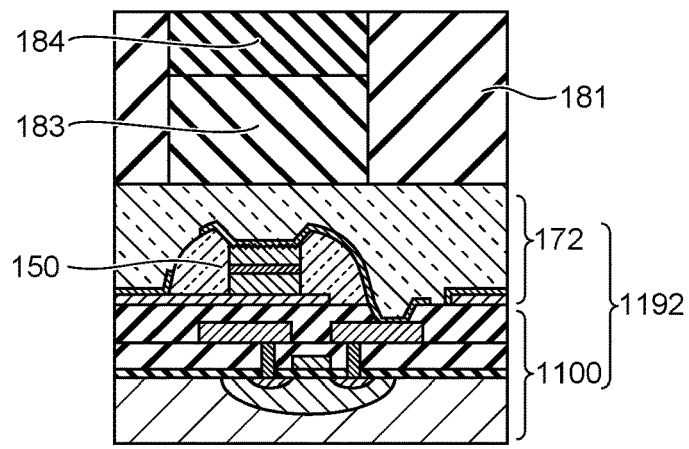
FIG. 11D is a schematic cross-sectional view illustrating the method for manufacturing the image display device of the first embodiment.

As shown in FIG. 11D, a coating material for the filter layer 184 is dispensed from the inkjet nozzle. The coating material is coated to overlap the coating of the fluorescer. The total thickness of the coating of the fluorescer and the coating material is set to be about equal to the thickness of the light-shielding part 181.

Thus, the image display device 1 can be manufactured.

Effects of the image display device 1 of the embodiment will now be described.

According to the method for manufacturing the image display device 1 of the embodiment, the semiconductor layer 1150 that includes the light-emitting layer 1152 for forming the light-emitting element 150 is bonded to the circuit board 1100 (100) that includes the circuit elements such as the transistor 103 that drives the light-emitting element 150, etc. Subsequently, the light-emitting element 150 is formed by etching the semiconductor layer 1150. Therefore, compared to individually transferring singulated light-emitting elements onto the circuit board 1100 (100), the process of transferring the light-emitting elements can be markedly shortened.

For example, in an image display device having 4K image quality, the number of subpixels is greater than 24 million; and in the case of an image display device having 8K image quality, the number of subpixels is greater than 99 million. When individually mounting such a large amount of light-emitting elements to a circuit board, an enormous amount of time is necessary, and it is difficult to realize an image display device that uses micro LEDs at a realistic cost. Also, when individually mounting a large amount of light-emitting elements, the yield decreases due to connection defects when mounting, etc., and an even higher cost is unavoidable.

Conversely, according to the method for manufacturing the image display device 1 of the embodiment, the entire semiconductor layer 1150 is adhered to the circuit board 1100 (100) before singulating the semiconductor layer 1150; therefore, the transfer process is completed when performed 1 time.

After directly forming the light-emitting element on the circuit board by etching, etc., the light-emitting element and the circuit element in the circuit board 1100 (100) are electrically connected by forming the light-transmitting electrodes 159*k* and 159*a*; therefore, a uniform connection structure can be realized, and the reduction of the yield can be suppressed.

Furthermore, alignment is unnecessary because the adhering to the circuit board 1100 (100) is performed at the wafer level without pre-singulating the semiconductor layer 1150 or forming electrodes at positions corresponding to the circuit elements. Therefore, the bonding process can be easily performed in a short period of time. Alignment is unnecessary when bonding, which is favorable for a higher definition display; also, downsizing of the light-emitting element 150 is easy.

When performing wafer bonding of the semiconductor layer 1150 to the circuit board 1100 according to the embodiment, the metal layers 1130 and 1120 are pre-formed on at least one of the bonding surface of the semiconductor layer 1150 or the circuit board 1100. Therefore, the wafer bonding can be easily performed by appropriately selecting the material of the metal layer.

The metal layer that is formed in the wafer bonding can be utilized as the second wiring layer 130 as the connection between the light-emitting element 150 and the outside, etc.

The insulating member 156 includes a convex surface that is convex from the wiring layer 130 toward the light-emitting surface 151S. Therefore, by appropriately setting the convex surface of the insulating member 156, the light that is radiated from the light-emitting layer 152 and has a component parallel to the light-emitting surface 151S can have a light distribution toward the light-emitting surface 151S side to have a normal component perpendicular to the light-emitting surface 151S, and the luminous efficiency can be substantially increased.

The wiring layer 130 can include the first wiring portion 130a, and the first wiring portion 130a can be light-reflective. By the first wiring portion 130a being light-reflective, the downward light radiated from the light-emitting element 150 can be reflected and re-reflected toward the light-emitting surface 151S side, and the luminous efficiency can be increased.

The first wiring portion 130a can shield the downward light radiated from the light-emitting element 150; therefore, malfunction of the circuit elements such as the transistor 103, etc., due to scattering of unnecessary light of the light-emitting element 150 can be prevented.

Second Embodiment

Figure 12:
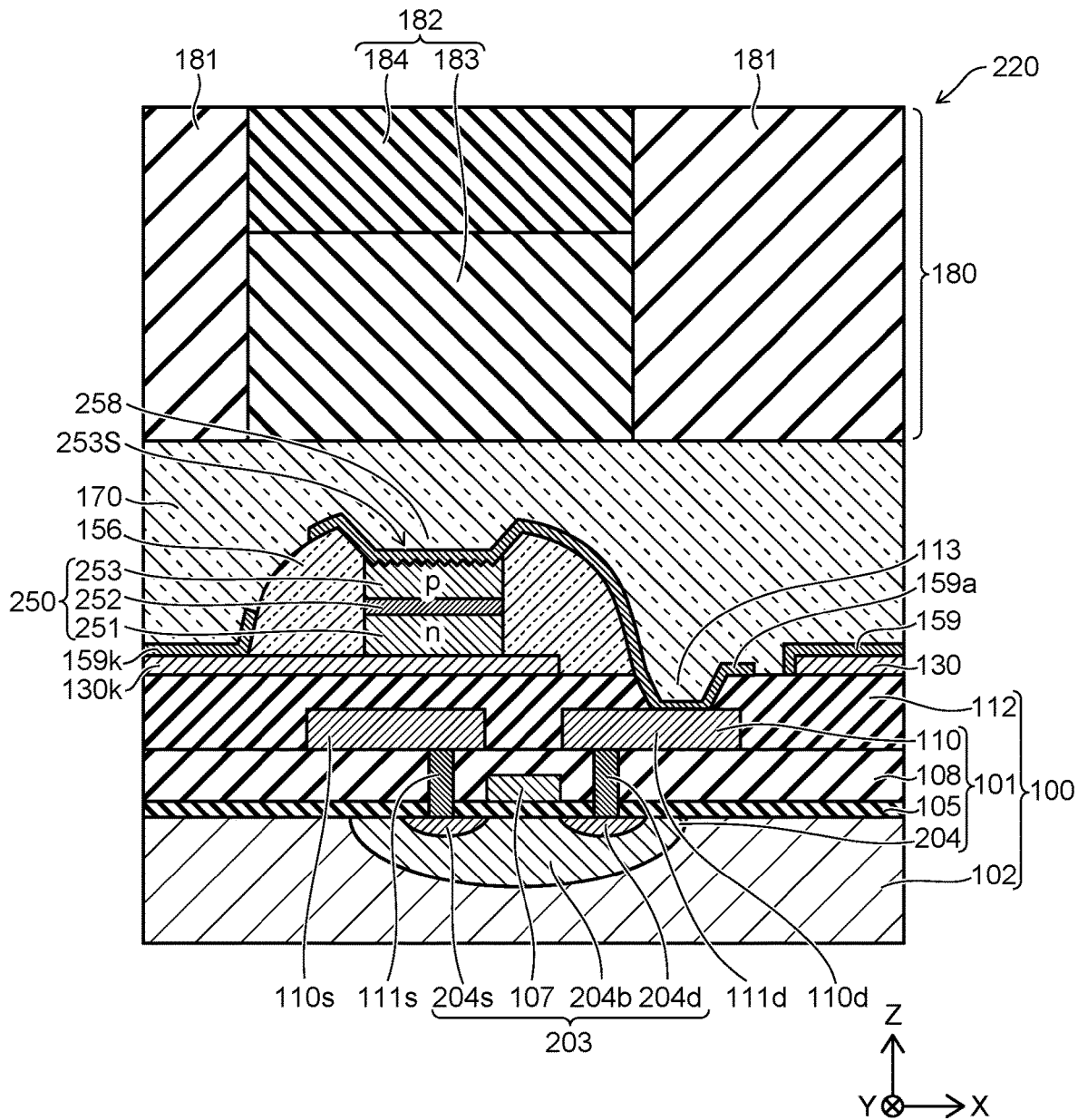
FIG. 12 is a schematic cross-sectional view illustrating a portion of an image display device according to a second embodiment.

FIG. 12 is a schematic cross-sectional view illustrating a portion of an image display device according to an embodiment.

FIG. 12 schematically shows a cross section when a subpixel 220 is cut by a plane parallel to the XZ plane.

The configuration of a light-emitting element 250 and the configuration of a transistor 203 that drives the light-emitting element 250 according to the embodiment are different from those of the other embodiments described above; otherwise, the embodiment is the same as the other embodiments. The same components as those of the other embodiments are marked with the same reference numerals, and a detailed description is omitted as appropriate.

As shown in FIG. 12, the subpixel 220 of the image display device of the embodiment includes the transistor 203 and the light-emitting element 250. The transistor 203 is formed in an element formation region 204 that is formed in the substrate 102. The element formation region 204 includes an n-type semiconductor region 204b and p-type semiconductor regions 204s and 204d. The n-type semiconductor region 204b is located at the surface vicinity of the substrate 102. The p-type semiconductor regions 204s and 204d are located in the n-type semiconductor region 204b, and are separated from each other at the surface vicinity of the n-type semiconductor region 204b.

The gate 107 is located on the n-type semiconductor region 204b with the insulating layer 105 interposed. The gate 107 is located between the p-type semiconductor regions 204s and 204d.

The structure of the upper portion of the transistor 203 and the structures of the wiring portions are the same as those of the other embodiments described above. According to the embodiment, the transistor 203 is a p-channel transistor, e.g., a p-channel MOSFET.

Similarly to the other embodiments, the second wiring layer 130 is formed on the inter-layer insulating film 112, and the wiring layer 130 includes a second wiring portion (a wiring part) 130k.

The light-emitting element 250 includes an n-type semiconductor layer 251, a light-emitting layer 252, and a p-type semiconductor layer 253. The n-type semiconductor layer 251, the light-emitting layer 252, and the p-type semiconductor layer 253 are stacked in this order from the inter-layer insulating film 112 side toward a light-emitting surface 253S side. Although the light-emitting element 250 has, for example, a substantially square or rectangular shape when projected onto the XY plane, the corners may be rounded. The light-emitting element 250 may have, for example, an elliptical shape or a circular shape when projected onto the XY plane. The degree of freedom of the layout is increased by appropriately selecting the shape, arrangement, and the like of the light-emitting element in a plan view.

The light-emitting element 250 may include the same materials as those of the other embodiments described above. For example, the light-emitting element 250 emits blue light of about 467 nm±20 nm or bluish-violet light of a wavelength of 410 nm±20 nm.

The n-type semiconductor layer 251 of the light-emitting element 250 is located on the second wiring portion 130k. It is favorable for the second wiring portion 130k and the n-type semiconductor layer 251 to have an ohmic connection.

The insulating member 156 covers a portion of the inter-layer insulating film 112, a portion of the second wiring layer 130, and at least the side surface of the light-emitting element 250. The insulating member 156 includes a convex surface that is convex toward the light-emitting surface 253S side. The insulating member 156 includes an opening 258. The opening 258 is formed on the light-emitting element 250, and the insulating member 156 is not located on the light-emitting surface 253S of the light-emitting element 250. It is favorable for the insulating member 156 to include a light-transmissive organic insulating material.

The light-emitting surface 253S is the surface of the p-type semiconductor layer 253 opposite to the surface contacting the light-emitting layer 252. It is favorable for the light-emitting surface 253S to be roughened.

The light-transmitting electrode 159a is located over the entire surface of the light-emitting surface 253S. The light-transmitting electrode 159a is located on the insulating member 156 and extends to the opening 113 of the inter-layer insulating film 112. The light-transmitting electrode 159a is located also on the wiring portion 110d exposed in the opening 113 of the inter-layer insulating film 112, and electrically connects the p-type semiconductor layer 253 and the wiring portion 110d.

The light-transmitting electrode 159k is located also on the second wiring portion 130k and connects the n-type semiconductor layer 251 together with the second wiring portion 130k to other circuits. In the example, the light-transmitting electrode 159k and the second wiring portion 130k are connected to the ground line 4 shown in FIG. 13 described below.

Figure 13:
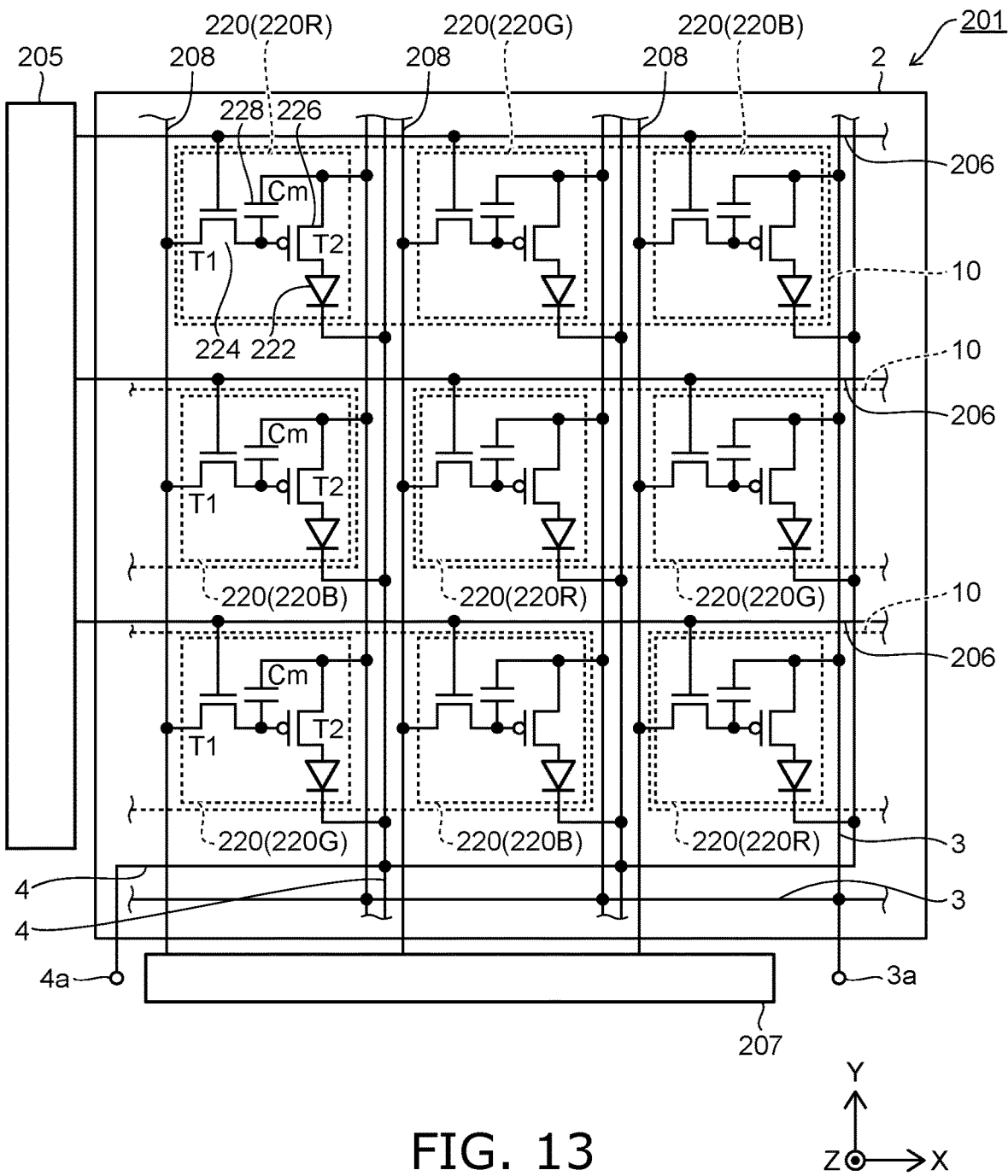
FIG. 13 is a schematic block diagram illustrating the image display device of the second embodiment.

FIG. 13 is a schematic block diagram illustrating the image display device according to the embodiment.

As shown in FIG. 13, the image display device 201 of the embodiment includes the display region 2, a row selection circuit 205, and a signal voltage output circuit 207. Similarly to the other embodiments described above, for example, the subpixels 220 are arranged in a lattice shape in the display region 2.

The subpixel 220 includes a light-emitting element 222, a select transistor 224, a drive transistor 226, and a capacitor 228. In FIG. 13, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a higher potential side than the light-emitting element 222. The drive transistor 226 is a p-channel MOSFET.

The select transistor 224 is connected between a signal line 208 with a gate electrode of the drive transistor 226. The capacitor 228 is connected between the power supply line 3 and the gate electrode of the drive transistor 226.

To drive the drive transistor 226 that is a p-channel MOSFET, the row selection circuit 205 and the signal voltage output circuit 207 supply a signal voltage that has a different polarity from those of the other embodiments described above and a select signal that has the same polarity as those of the other embodiments described above to a scanning line 206 and the signal line 208.

According to the embodiment, the polarity of the drive transistor 226 is a p-channel; therefore, the polarities of the signal voltages, etc., are different from those of the other embodiments described above. In other words, the row selection circuit 205 supplies a select signal to the scanning line 206 to sequentially select one row from the arrangement of the m rows of the subpixels 220. The signal voltage output circuit 207 supplies signal voltages that have analog voltage values necessary for the subpixels 220 of the selected row. The drive transistors 226 of the subpixels 220 of the selected row cause currents that correspond to the signal voltages to flow in the light-emitting elements 222. The light-emitting elements 222 emit light of luminances corresponding to the currents that flow.

A method for manufacturing the image display device 201 of the embodiment will now be described.

FIGS. 14A to 15C are schematic cross-sectional views illustrating the method for manufacturing the image display device of the embodiment.

According to the embodiment, a semiconductor growth substrate 1294 that is different from the semiconductor growth substrate 1194 already described in FIG. 5A is prepared.

Figure 14A:
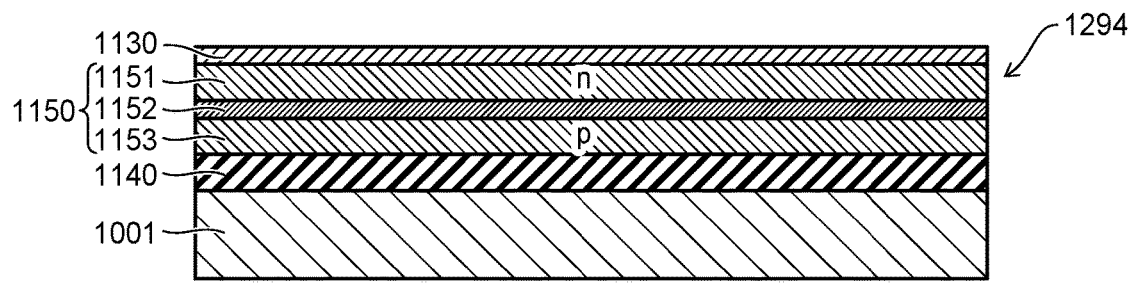
FIG. 14A is a schematic cross-sectional view illustrating a method for manufacturing the image display device of the second embodiment.

As shown in FIG. 14A, the semiconductor growth substrate 1294 includes the semiconductor layer 1150 that is grown on the crystal growth substrate 1001. Although the semiconductor layer 1150 is grown on the crystal growth substrate 1001 via the buffer layer 1140 in the example, the semiconductor layer 1150 may be grown without interposing the buffer layer 1140 similarly to the other embodiments described above.

According to the embodiment, the semiconductor growth substrate 1294 includes the p-type semiconductor layer 1153, the light-emitting layer 1152, and the n-type semiconductor layer 1151 stacked in this order from the buffer layer 1140 side. The metal layer 1130 is formed at the surface at which the n-type semiconductor layer 1151 is not covered.

Figure 14B:
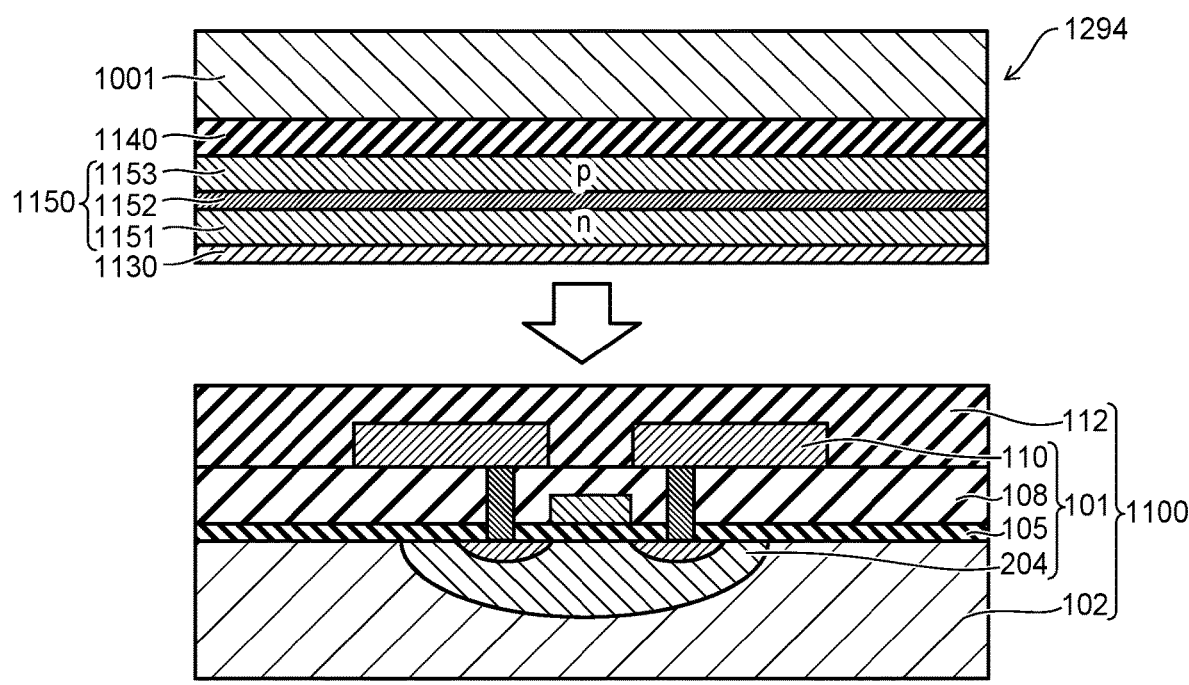
FIG. 14B is a schematic cross-sectional view illustrating the method for manufacturing the image display device of the second embodiment.

As shown in FIG. 14B, the semiconductor growth substrate 1294 is vertically inverted, and is bonded with the circuit board 1100. As shown by the arrow of the drawing, one surface of the circuit board 1100 and the surface of the metal layer 1130 formed on the semiconductor layer 1150 are bonded to each other. The bonding surface of the circuit board 1100 is the exposed surface of the inter-layer insulating film 112.

When performing the wafer bonding described above, the modifications described in reference to FIGS. 6A to 7B are applicable. In other words, the semiconductor growth substrate may be adhered to the circuit board 1100 without inverting after transferring the support substrate 1190 onto the semiconductor layer 1150. In such a case, the semiconductor growth substrate 1194 in which the n-type semiconductor layer 1151, the light-emitting layer 1152, and the p-type semiconductor layer 1153 are stacked in this order from the crystal growth substrate 1001 side is used. Also, a metal layer may be provided in at least one of the semiconductor layer 1150 or the circuit board 1100, and the semiconductor layer 1150 that is formed by crystal growth may be bonded without interposing the buffer layer 1140.

Figure 15A:
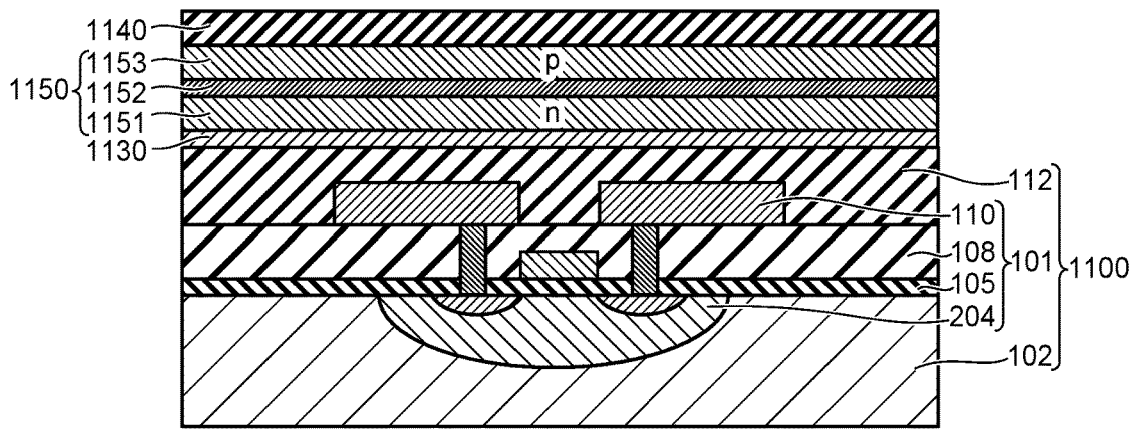
FIG. 15A is a schematic cross-sectional view illustrating the method for manufacturing the image display device of the second embodiment.

As shown in FIG. 15A, the crystal growth substrate 1001 is removed from the semiconductor growth substrate 1294 bonded to the circuit board 1100 by using laser lift-off, etc.

Figure 15B:
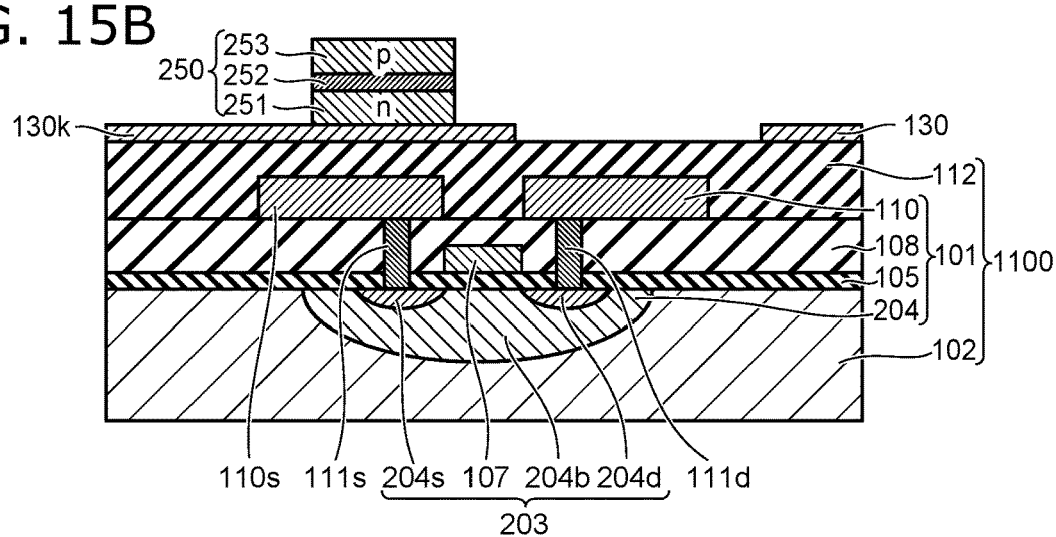
FIG. 15B is a schematic cross-sectional view illustrating the method for manufacturing the image display device of the second embodiment.

As shown in FIG. 15B, similarly to the other embodiments, the buffer layer 1140 is removed by appropriately using wet etching or dry etching, the second wiring layer 130 is formed from the metal layer 1130, and the light-emitting element 250 is formed from the semiconductor layer 1150.

Figure 15C:
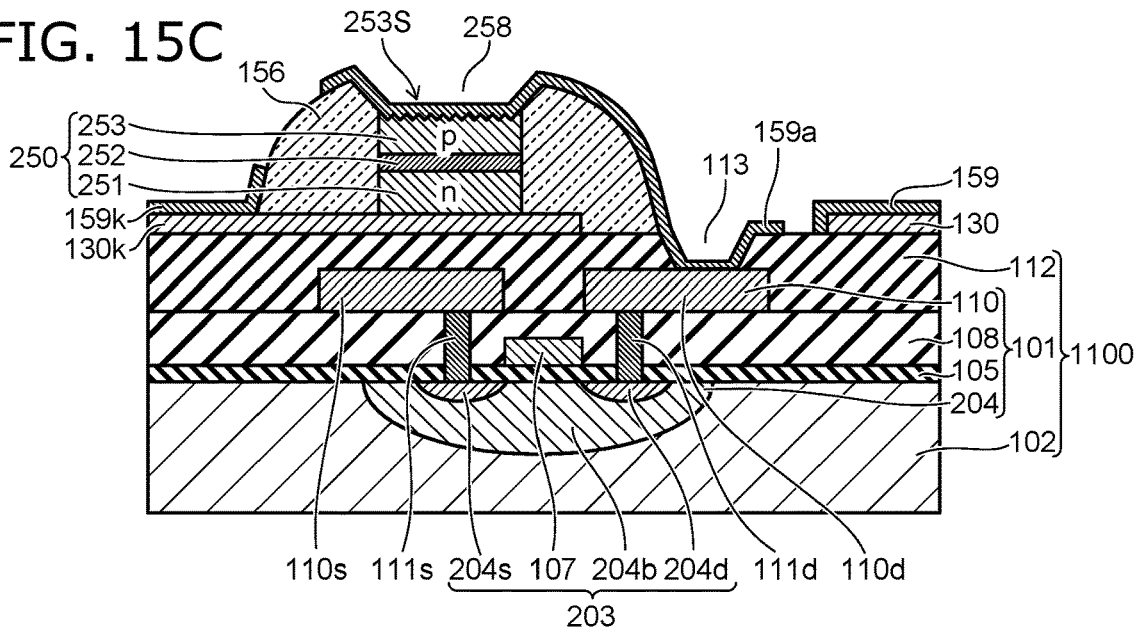
FIG. 15C is a schematic cross-sectional view illustrating the method for manufacturing the image display device of the second embodiment.

As shown in FIG. 15C, a portion of the wiring portion 110d is exposed by forming the opening 113 in the inter-layer insulating film 112. The insulating member 156 is formed to cover a portion of the second wiring portion 130k, a portion of the inter-layer insulating film 112, and the light-emitting element 250. The light-emitting surface 253S is exposed by removing a portion of the insulating member 156. The p-type semiconductor layer 253 and the wiring portion 110d are electrically connected by the light-transmitting electrode 159a.

Effects of the image display device 201 of the embodiment will now be described.

The embodiment includes effects similar to those of the other embodiments described above. Namely, the individual light-emitting elements 250 are formed by etching after bonding the semiconductor layer 1150 to the circuit board 1100; therefore, the transfer process of the light-emitting elements can be markedly shortened.

By forming the shape of the insulating member 156 to be convex toward the light-emitting surface 253S side, the sideward and/or downward radiated light from the light-emitting element 250 can have a light distribution toward the light-emitting surface 253S side. Therefore, the luminous efficiency can be substantially increased.

Third Embodiment

According to the embodiment, the shape of the side surface of the light-emitting element is different from those of the other embodiments described above. The other components of the embodiment are the same as those of the other embodiments; the same components are marked with the same reference numerals, and a detailed description is omitted as appropriate.

Figure 16:
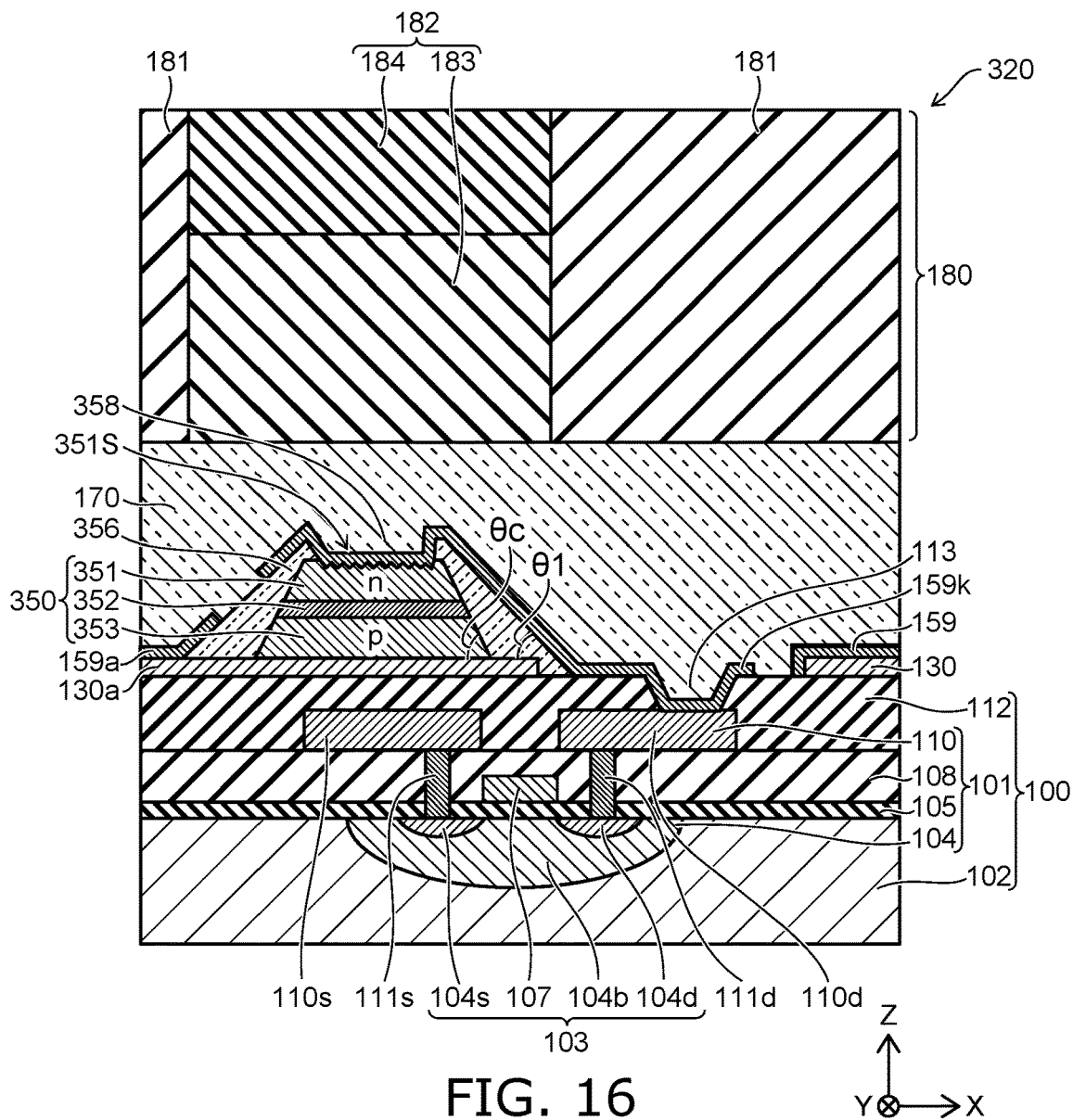
FIG. 16 is a schematic cross-sectional view illustrating a portion of an image display device according to a third embodiment.

FIG. 16 is a schematic cross-sectional view illustrating a portion of the image display device according to the embodiment.

FIG. 16 schematically shows a cross section when a subpixel 320 is cut by a plane parallel to the XZ plane.

A light-emitting element 350 of the embodiment includes a p-type semiconductor layer 353, a light-emitting layer 352, and an n-type semiconductor layer 351 stacked in this order from the first wiring portion 130a side toward a light-emitting surface 351S side. The light-emitting surface 351S is a surface of the n-type semiconductor layer 351, and is the surface opposite to the surface at which the light-emitting layer 352 is located.

The side surface of the light-emitting element 350 is set so that an angle θc between the side surface of the light-emitting element 350 and the surface of the first wiring portion 130a at which the light-emitting element 350 is located is less than 90°. That is, the side surface of the light-emitting element 350 is not a perpendicular surface but a sloped surface from the first wiring portion 130a. The light-emitting element 350 is formed in a truncated pyramid shape, a truncated circular conical shape, or the like that has a bottom surface on the surface of the first wiring portion 130a and has the light-emitting surface 351S as the upper surface.

In the example, the surface of an insulating member 356 that covers the side surface of the light-emitting element 350 also has a slope from the first wiring portion 130a according to the slope of the side surface of the light-emitting element 350. An angle θ1 between the surface of the first wiring portion 130a and the surface of the insulating member 356 is set to be less than the angle θc.

The insulating member 356 is a light-transmissive insulating material, and favorably is a transparent resin. It is favorable for the refractive index of the insulating member 356 to be greater than the refractive index of the adhesive layer 170 covering the insulating member 356.

Figure 17:
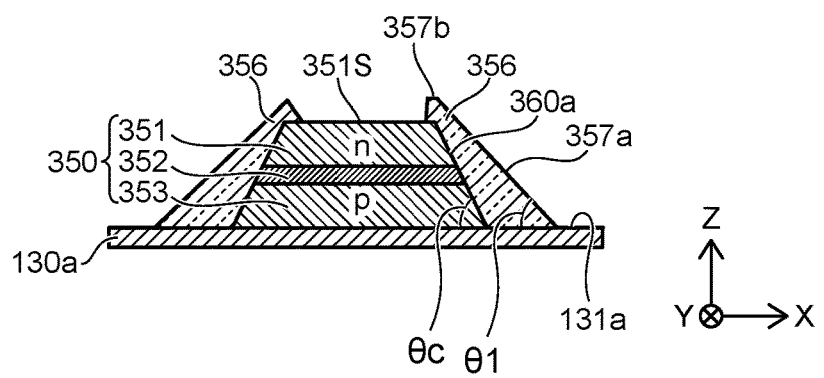
FIG. 17 is a schematic cross-sectional view illustrating a portion of the image display device of the third embodiment.

FIG. 17 is a schematic cross-sectional view illustrating a portion of the image display device of the embodiment.

FIG. 17 shows a detailed positional relationship between the first wiring portion 130a and the light-emitting element 350.

As shown in FIG. 17, the first wiring portion 130a includes the first surface 131a. The first surface 131a is a plane that is substantially parallel to the XY plane. The first wiring portion 130a is formed of a material that has high light reflectivity, and the light that is incident on the first surface 131a is reflected with a high reflectance.

The light-emitting element 350 is placed on the first surface 131a of the first wiring portion 130a. The light-emitting element 350 includes a side surface 360a. The side surface 360a is a surface between the light-emitting surface 351S and the first surface 131a, and is a surface adjacent to the light-emitting surface 351S. The angle θc between the side surface 360a and the first surface 131a is less than 90°. It is favorable for the angle θc to be about 70°. It is more favorable for the angle θc to be less than the critical angle of the side surface 360a determined based on the refractive index of the light-emitting element 350 and the refractive index of the insulating member 356.

The insulating member 356 is provided to cover at least the side surface 360a of the light-emitting element 350. The insulating member 356 includes a side surface 357a. The side surface 357a is a surface between a top portion 357b and a surface 131a of the insulating member 356. The top portion 357b of the insulating member 356 is the height from the surface 131a of the insulating member 356 and is the highest position. The height from the first surface 131a of the insulating member 356 is the length in the positive direction of the Z-axis between the first surface 131a and the top portion 357b.

The angle θ1 between the surface 131a and the side surface 357a of the insulating member 356 is, for example, less than the angle θc. The shape of the side surface 357a of the insulating member 356 is not limited to a straight line such as that of the example. It is favorable for the shape of the side surface 357a of the insulating member 356 to be set to cause the light emitted from the side surface 357a to have a light distribution in the direction of the light-emitting surface 351S. For example, similarly to the other embodiments described above, the side surface 357a may include a convex surface that is convex toward the light-emitting surface 351S side.

For example, the angle θc between the side surface 360a of the light-emitting element 350 and the first surface 131a of the first wiring portion 130a is determined as follows. A critical angle θc0 of the light emitted from the light-emitting element 350 to the insulating member 356 is determined using the following Formula (1) using a refractive index n0 of the light-emitting element 350 and a refractive index n1 of the insulating member 356.

$$\theta c0 = 90° - \sin^{-1}(n1/n0) \qquad (1)$$

For example, it is known that the refractive index of a general transparent organic insulating material such as an acrylic resin or the like is about 1.4 to 1.5. Therefore, when the light-emitting element 350 is formed of GaN and the insulating member 356 is formed of a general transparent organic insulating material, the light-emitting element 350 refractive index n0=2.5 and the insulating member 356 refractive index n=1.4 can be obtained. The critical angle θc0=56° is obtained by substituting these values in Formula (1).

This shows that when the angle θc between the first surface 131a and the side surface 360a is set to 56°, the light that is radiated from the light-emitting layer 352 parallel to the first surface 131a undergoes total internal reflection at the side surface 360a. This also shows that the light that is radiated from the light-emitting layer 352 and has the negative-direction component of the Z-axis also undergoes total internal reflection at the side surface 360a.

On the other hand, the light that is radiated from the light-emitting layer 352 and has a positive-direction component of the Z-axis is emitted from the side surface 360a at an emergence angle corresponding to the refractive index at the side surface 360a. The light that is incident on the insulating member 356 is emitted from the insulating member 356 at an angle that is determined by the refractive index of the insulating member 356 and the refractive index of the adhesive layer 170 shown in FIG. 16. The refractive index of the adhesive layer 170 is set to be less than the refractive index of the insulating member 356; therefore, the angle of the light incident on the adhesive layer 170 is oriented more toward the light-emitting surface 351S side.

The light that undergoes total internal reflection at the side surface 360a is re-reflected by the first wiring portion 130a, and the re-reflected light that has a positive-direction component of the Z-axis is emitted from the light-emitting surface 351S and the side surface 360a. The light that is parallel to the first surface 131a and the light that has the negative-direction component of the Z-axis undergo total internal reflection at the side surface 360a.

Thus, among the light that is radiated from the light-emitting layer 352, the light that is parallel to the first surface 131a and the light that has the negative-direction component of the Z-axis are converted into light that has a component toward the positive direction of the Z-axis by the side surface 360a and the first wiring portion 130a. Accordingly, the proportion of the light emitted from the light-emitting element 350 that is oriented toward the light-emitting surface 351S increases, and the substantial luminous efficiency of the light-emitting element 350 improves.

By setting θc<θc0, substantially all of the light having the component parallel to the first surface 131a can undergo total internal reflection in the light-emitting element 350. The critical angle θc0 is about 56° when the refractive index of the insulating member 356 is n=1.4; therefore, it is more favorable for the angle θc that is set to be 45°, 30°, etc. Also, the critical angle θc0 is smaller for a material in which the refractive index n is larger. However, even if the angle θc is set to be about 70°, substantially all of the light having the negative-direction component of the Z-axis can be converted into light that has a positive-direction component of the Z-axis; therefore, by considering manufacturing fluctuation, etc., for example, the angle θc may be set to be not more than 80°, etc.

A method for manufacturing the image display device of the embodiment will now be described.

The processes up to forming the light-emitting element 350 according to the embodiment can be similar to FIGS. 5A to 8A according to the other embodiments described above. The processes after the process of FIG. 8A will now be described.

Figure 18A:
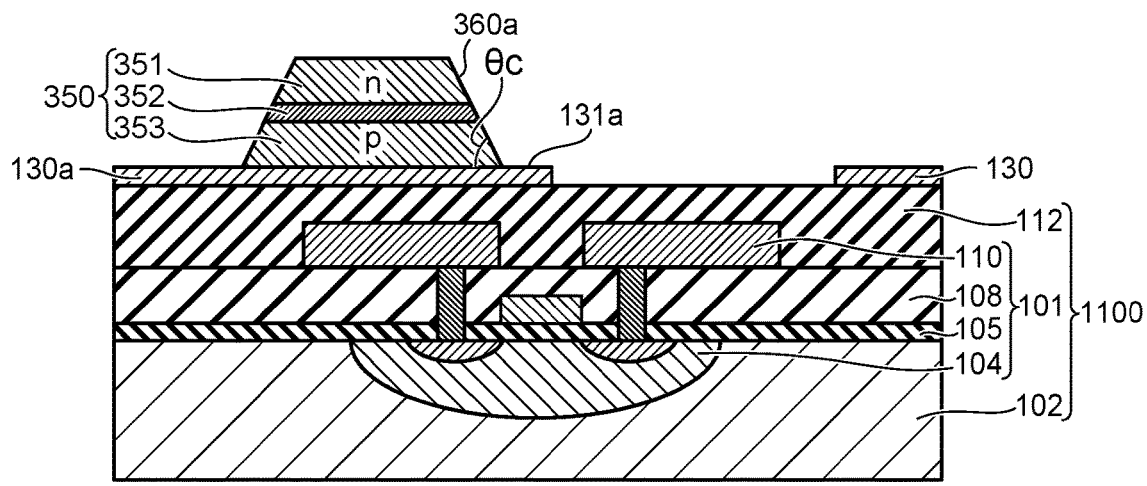
FIG. 18A is a schematic cross-sectional view illustrating a method for manufacturing the image display device of the third embodiment.
Figure 18B:
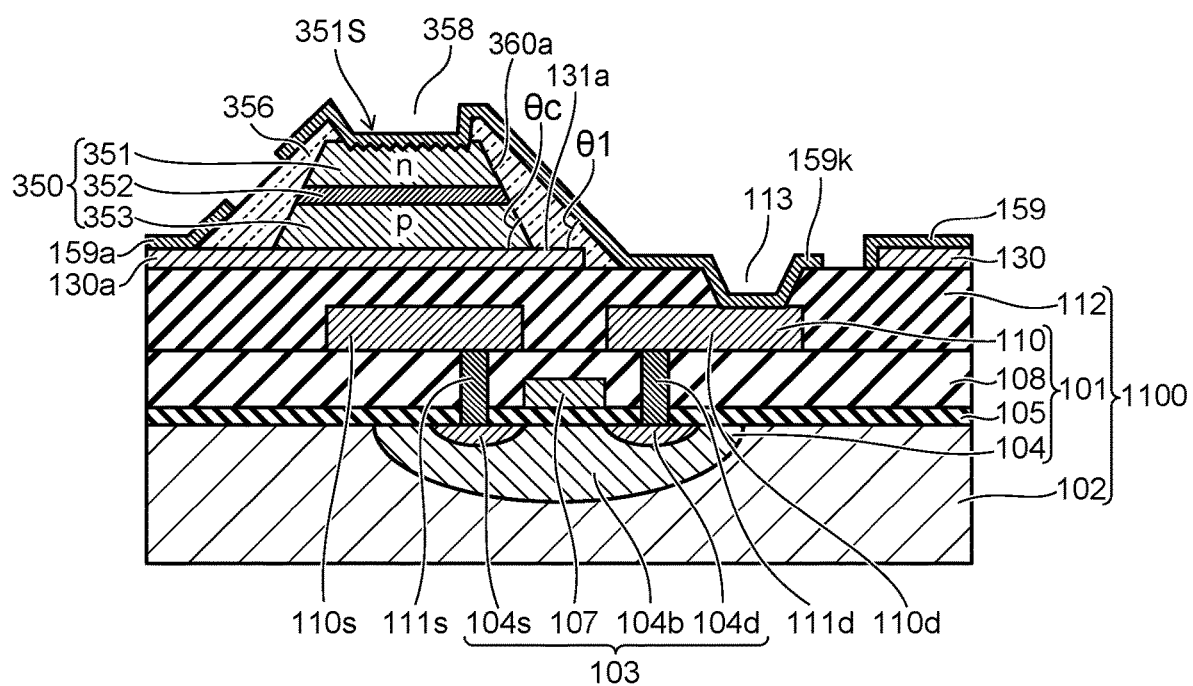
FIG. 18B is a schematic cross-sectional view illustrating the method for manufacturing the image display device of the third embodiment.

FIGS. 18A and 18B are schematic cross-sectional views illustrating the method for manufacturing the image display device of the embodiment.

As shown in FIG. 18A, after removing the buffer layer 1140 by wet etching, etc., the metal layer 1130 and the semiconductor layer 1150 are formed in the necessary shape by etching.

The semiconductor layer 1150 is further formed into the shape of the light-emitting element 350. When forming the light-emitting element 350, the rate of the etching is selected so that the side surface 360a of the light-emitting element 350 has the angle θc with respect to the surface of the first wiring portion 130a. For example, the etching rate of the etching is selected to be higher proximate to the light-emitting surface 351S. It is favorable for the etching rate to be set to linearly increase from the surface 131a side toward the light-emitting surface 351S side.

Specifically, for example, a contrivance is made when exposing so that the resist mask pattern in the dry etching gradually becomes thin toward the end portion of the resist mask pattern. Thereby, the resist gradually recedes in the dry etching from the thin portion of the resist, and the etching amount can be increased toward the light-emitting surface 351S side. Thereby, the side surface 360a of the light-emitting element 350 is formed to have a constant angle with respect to the surface 131a. Therefore, the light-emitting element 350 is formed so that the surface area increases in the order of the p-type semiconductor layer 353, the light-emitting layer 352, and the n-type semiconductor layer 351 from the light-emitting surface 351S in a plan view.

Subsequently, the second wiring layer 130 is formed by etching the metal layer 1130. The wiring layer 130 includes the first wiring portion 130a. The first wiring portion 130a is formed in the shape described above by the etching.

Effects of the image display device of the embodiment will now be described.

The image display device of the embodiment provides the other effects described below while providing effects similar to the image display devices of the other embodiments described above.

In the image display device of the embodiment, the light-emitting element 350 is formed to include a side surface that has the angle θc with respect to the first surface 131a of the first wiring portion 130a at which the light-emitting element 350 is located. The angle θc is less than 90°, and is set based on the critical angle θc0 determined by the refractive indexes of the materials of the light-emitting element 350 and the insulating member 356. The light that is radiated from the light-emitting layer 352 and is oriented sideward and/or below the light-emitting element 350 can be converted into light oriented toward the light-emitting surface 351S side by the angle θc and emitted. By setting the angle θc to be sufficiently small, the substantial luminous efficiency of the light-emitting element 350 is increased.

Fourth Embodiment

According to the embodiment, an image display device that has a higher luminous efficiency is realized by forming multiple light-emitting surfaces that correspond to multiple light-emitting elements in a single semiconductor layer that includes a light-emitting layer. In the following description, the same components as those of the other embodiments described above are marked with the same reference numerals, and a detailed description is omitted as appropriate.

Figure 19:
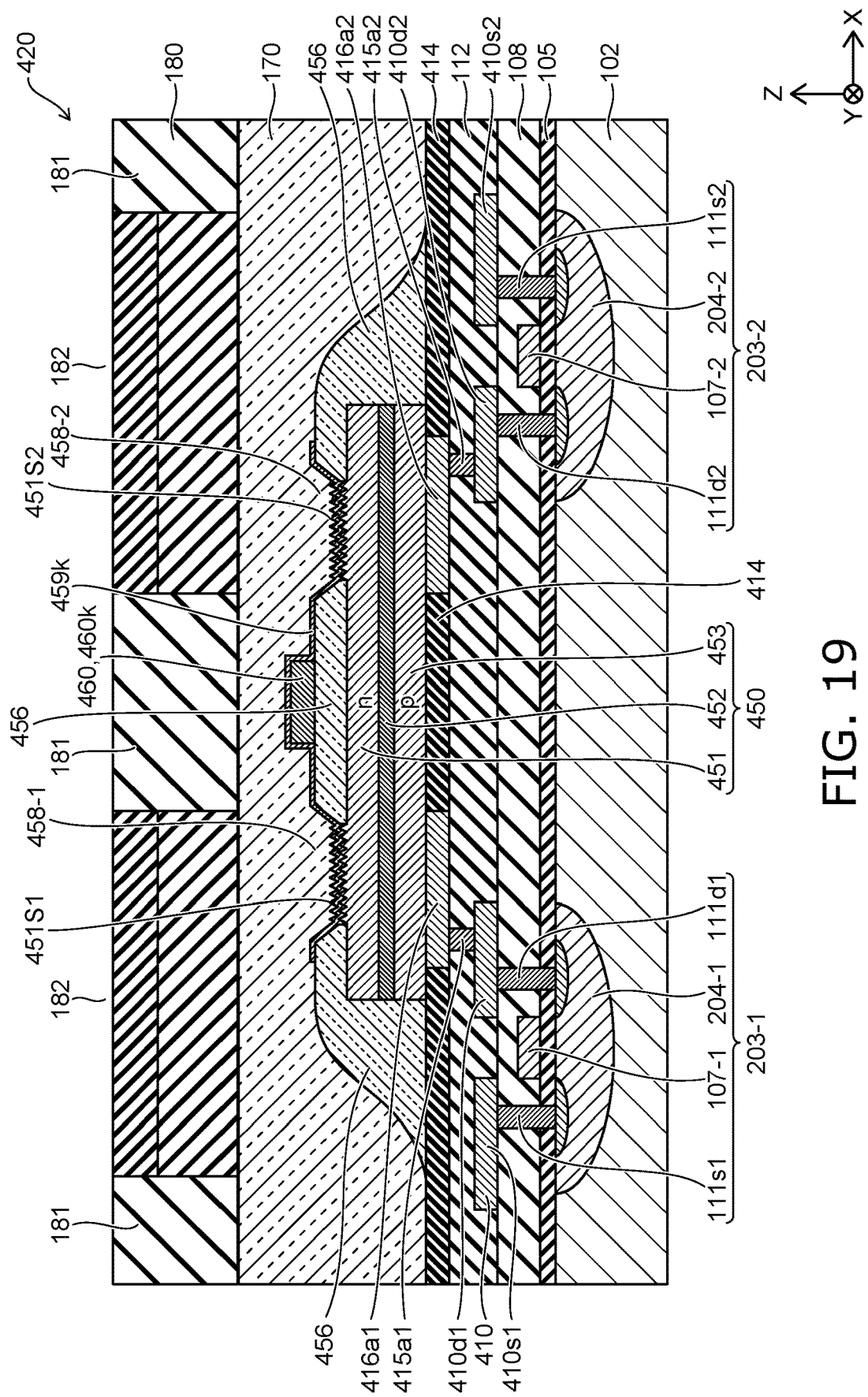
FIG. 19 is a schematic cross-sectional view illustrating a portion of an image display device according to a fourth embodiment.

FIG. 19 is a schematic cross-sectional view illustrating a portion of the image display device according to the embodiment.

As shown in FIG. 19, the image display device includes a subpixel group 420. The subpixel group 420 includes transistors 203-1 and 203-2, a first wiring layer 410, the inter-layer insulating film 112, plugs 416a1 and 416a2, a semiconductor layer 450, and an insulating member 456.

According to the embodiment, by switching the p-channel transistors 203-1 and 203-2 on, holes are injected into the semiconductor layer 450 via the plugs 416a1 and 416a2, electrons are injected into the semiconductor layer 450 via a wiring layer 460, and a light-emitting layer 452 is caused to emit light. For example, the circuit configuration shown in FIG. 13 is applied to the drive circuit. Using the other embodiments described above, the n-type semiconductor layer and the p-type semiconductor layer of the semiconductor layer may be vertically interchanged. The semiconductor layer 450 is driven by n-channel transistors. In such a case, for example, the circuit configuration of FIG. 4 is applied to the drive circuit.

The semiconductor layer 450 includes two light-emitting surfaces 451S1 and 451S2, and the subpixel group 420 substantially includes two subpixels. According to the embodiment, similarly to the other embodiments described above, a display region is formed by arranging the subpixel group 420 that substantially includes two subpixels in a lattice shape.

The transistors 203-1 and 203-2 are formed respectively in element formation regions 204-1 and 204-2. In the example, the element formation regions 204-1 and 204-2 are n-type semiconductor layers, and p-type semiconductor layers are formed to be separated from each other in the n-type semiconductor layer. The n-type semiconductor layer includes a channel region, and the p-type semiconductor layers respectively include a source region and a drain region.

The insulating layer 105 is formed on the element formation regions 204-1 and 204-2, and gates 107-1 and 107-2 each are formed with the insulating layer 105 interposed. The gates 107-1 and 107-2 are gates of the transistors 203-1 and 203-2. The transistors 203-1 and 203-2 are p-channel transistors, e.g., p-channel MOSFETs.

The insulating film 108 covers the tops of the two transistors 203-1 and 203-2. The wiring layer 410 is formed on the insulating film 108.

Vias 111s1 and 111d1 are located between the wiring layer 410 and the p-type semiconductor layers of the transistor 203-1. Vias 111s2 and 111d2 are located between the wiring layer 410 and the p-type semiconductor layers of the transistor 203-2.

The wiring layer 410 includes wiring portions 410s1, 410s2, 410d1, and 410d2. The wiring portions 410s1 and 410s2 are electrically connected respectively to the p-type semiconductor layers corresponding to the source electrodes of the transistors 203-1 and 203-2 by the vias 111s1 and 111s2. For example, the wiring portions 410s1 and 410s2 are connected to the power supply line 3 shown in FIG. 13.

The wiring portions 410d1 and 410d2 are connected respectively to the p-type semiconductor layers corresponding to the drain electrodes of the transistors 203-1 and 203-2 by the vias 111d1 and 111d2.

The inter-layer insulating film 112 covers the transistors 203-1 and 203-2 and the wiring layer 410. The plugs 416a1 and 416a2 are formed on the inter-layer insulating film 112.

A planarization film 414 is formed on the inter-layer insulating film 112. The planarization film 414 is located also between the plugs 416a1 and 416a2. The plugs 416a1 and 416a2 are buried in the planarization film 414. The planarization film 414 and the plugs 416a1 and 416a2 include surfaces that are in the same plane when projected onto the XY plane. These surfaces are surfaces at the side opposite to the surface at the inter-layer insulating film 112 side.

A connection portion 415a1 is located between the plug 416a1 and the wiring portion 410d1. The connection portion 415a1 electrically connects the plug 416a1 and the wiring portion 410d1. A connection portion 415a2 is located between the plug 416a2 and the wiring portion 410d2. The connection portion 415a2 electrically connects the plug 416a2 and the wiring portion 410d2.

The semiconductor layer 450 is located on the planarization film 414 and the plugs 416a1 and 416a2.

The semiconductor layer 450 includes a p-type semiconductor layer 453, the light-emitting layer 452, and an n-type semiconductor layer 451. The semiconductor layer 450 includes the p-type semiconductor layer 453, the light-emitting layer 452, and the n-type semiconductor layer 451 stacked in this order from the inter-layer insulating film 112 side toward the side of the light-emitting surfaces 451S1 and 451S2. The plugs 416a1 and 416a2 are connected with the p-type semiconductor layer 453.

The insulating member 456 covers a portion of the planarization film 414. The insulating member 456 covers a portion of the semiconductor layer 450. It is favorable for the insulating member 456 to cover the surface of the n-type semiconductor layer 451 other than the light-emitting surfaces (the exposed surfaces) 451S1 and 451S2 of the semiconductor layer 450. The insulating member 456 covers the side surface of the semiconductor layer 450. For example, the insulating member 456 is formed of a light-transmissive organic insulating material, etc., and favorably is formed of a transparent resin.

The insulating member 456 includes a surface that is convex toward the side of the light-emitting surfaces 451S1 and 451S2. The insulating member 456 causes the light radiated from the side surface of the semiconductor layer 450 to have a light distribution toward the side of the light-emitting surfaces 451S1 and 451S2 due to the convex surface. Therefore, the substantial luminous efficiency of the semiconductor layer 450 is increased.

Openings 458-1 and 458-2 are formed in the part of the semiconductor layer 450 that is not covered with the insulating member 456. The openings 458-1 and 458-2 are formed at positions corresponding to the light-emitting surfaces 451S1 and 451S2. The light-emitting surfaces 451S1 and 451S2 are formed at positions that are separated from each other on the n-type semiconductor layer 451. The light-emitting surface 451S1 is located at the position that is more proximate to the transistor 203-1 on the n-type semiconductor layer 451. The light-emitting surface 451S2 is located at the position that is more proximate to the transistor 203-2 on the n-type semiconductor layer 451.

The openings 458-1 and 458-2 are, for example, square or rectangular when projected onto the XY plane. The openings 458-1 and 458-2 are not limited to rectangular and may be circular, elliptical, polygonal such as hexagonal, etc. The light-emitting surfaces 451S1 and 451S2 also are square, rectangular, another polygon, circular, etc., when projected onto the XY plane. The shapes of the light-emitting surfaces 451S1 and 451S2 may be similar to the shapes of the openings 458-1 and 458-2 or may be different shapes.

The wiring layer 460 (the third wiring layer) is located on the insulating member 456. The wiring layer 460 includes an wiring portion 460k. The wiring portion 460k is located on the insulating member 456 that is located on the n-type semiconductor layer 451 between the openings 458-1 and 458-2. For example, the wiring portion 460k is connected to the ground line 4 shown in FIG. 13. In FIG. 19, the reference numeral of the wiring layer 460 also is shown as the reference numeral of the wiring portion 460k and shows that the wiring layer 460 includes the wiring portion 460k. This is similar in FIG. 24 described below as well.

A light-transmitting electrode 459k is located over the light-emitting surfaces 451S1 and 451S2 of the n-type semiconductor layer 451 exposed in the openings 458-1 and 458-2. The light-transmitting electrode 459k is located on the wiring portion 460k. The light-transmitting electrode 459k is located between the light-emitting surface 451S1 and the wiring portion 460k and located between the light-emitting surface 451S2 and the wiring portion 460k. The light-transmitting electrode 459k electrically connects the light-emitting surfaces 451S1 and 451S2 and the wiring portion 460k.

As described above, the light-transmitting electrode 459k is connected to the light-emitting surfaces 451S1 and 451S2 exposed in the openings 458-1 and 458-2. Therefore, the electrons that are supplied from the light-transmitting electrode 459k are supplied from the exposed light-emitting surfaces 451S1 and 451S2 to the n-type semiconductor layer 451. On the other hand, the holes are supplied to the p-type semiconductor layer 453 via the plugs 416a1 and 416a2.

The transistors 203-1 and 203-2 are drive transistors of adjacent subpixels, and are sequentially driven. Accordingly, holes that are supplied from one of the two transistors 203-1 and 203-2 are injected into the light-emitting layer 452; electrons that are supplied from the wiring portion 460k are injected into the light-emitting layer 452, and the light-emitting layer 452 emits light.

The opening 458-1 and the light-emitting surface 45151 are located at the position of the n-type semiconductor layer 451 that is more proximate to the transistor 203-1. Therefore, when the transistor 203-1 is switched on, the holes are injected via the wiring portion 410*d*1, the connection portion 415*a*1, and the plug 416*a*1, and the light-emitting surface 451S1 emits light.

On the other hand, the opening 458-2 and the light-emitting surface 45152 are located at the position of the n-type semiconductor layer 451 that is more proximate to the transistor 203-2. Therefore, when the transistor 203-2 is switched on, the light-emitting surface 451S2 emits light via the wiring portion 410*d*2, the connection portion 415*a*2, and the plug 416*a*2.

Although the plugs 416*a*1 and 416*a*2 perform the roles of light-shielding layers and reflective layers according to the embodiment, in the gap sandwiched between the plugs 416*a*1 and 416*a*2, the insulative planarization film 414 is provided, and a layer that performs the roles of a light-shielding layer and a reflective layer is not included. The gap is necessary because drive voltages that are different between the two plugs 416*a*1 and 416*a*2 are applied. The n-type semiconductor layer 451 and the p-type semiconductor layer 453 include resistances, and a drift current that flows in a direction parallel to the XY plane in a semiconductor layer 550 is suppressed by the resistances. Therefore, the substantial light-emitting region is limited to the region sandwiched between the light-emitting surface 451S1 and the plug 416*a*1 and the region sandwiched between the light-emitting surface 451S2 and the plug 416*a*2. Accordingly, the roles of the light-shielding layers and the reflective layers are sufficiently performed by providing the plugs 416*a*1 and 416*a*2 to cover directly under the light-emitting surfaces 451S1 and 451S2.

A method for manufacturing the image display device of the embodiment will now be described.

FIGS. 20A to 23B are schematic cross-sectional views illustrating the method for manufacturing the image display device of the embodiment.

Processes of forming the plugs 416*a*1 and 416*a*2 on a circuit board 4100 is shown in FIGS. 20A to 21B.

Processes of forming the subpixel group 420 by using the semiconductor growth substrate 1194 and the circuit board 4100 on which the plugs 416*a*1 and 416*a*2 are formed are shown in FIGS. 22A to 23B.

Figure 20A:
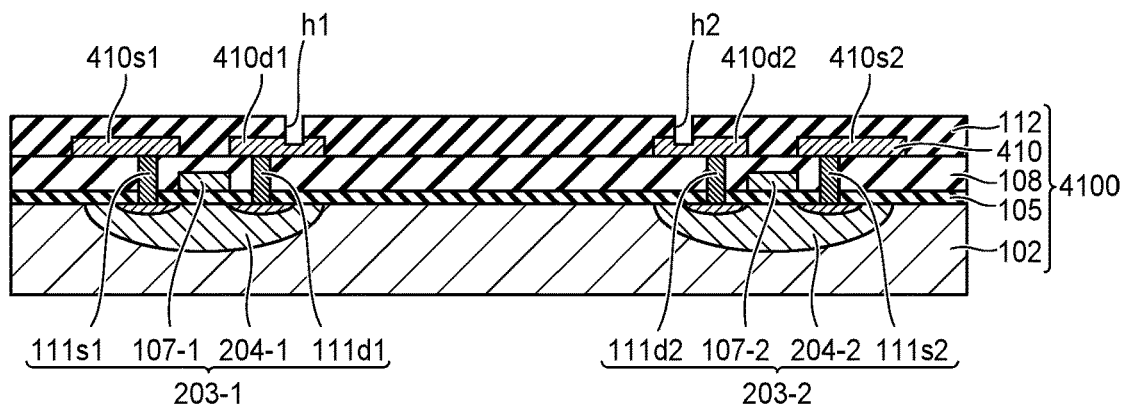
FIG. 20A is a schematic cross-sectional view illustrating a method for manufacturing the image display device of a modification of the fourth embodiment.

As shown in FIG. 20A, the circuit board 4100 is prepared, and contact holes h1 and h2 are formed in the inter-layer insulating film 112. The positions at which the contact holes h1 and h2 are formed are positions at which the wiring portions 410*d*1 and 410*d*2 are located. The contact holes h1 and h2 are formed to depths that expose the surfaces of the wiring portions 410*d*1 and 410*d*2.

Figure 20B:
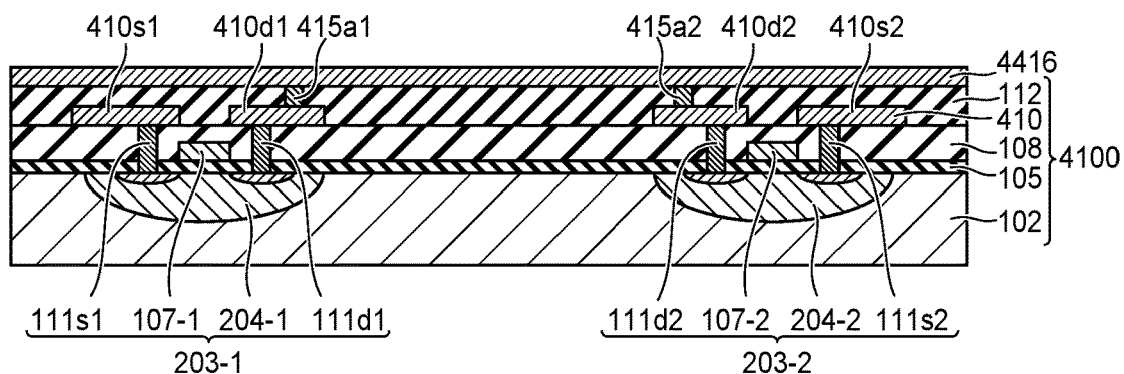
FIG. 20B is a schematic cross-sectional view illustrating the method for manufacturing the image display device of the modification of the fourth embodiment.

As shown in FIG. 20B, a metal layer 4416 is formed over the entire surface on the inter-layer insulating film 112. The contact holes h1 and h2 are filled with the same conductive material as the metal layer 4416 simultaneously with the formation of the metal layer 4416. The connection portions 415*a*1 and 415*a*2 are formed in the contact holes h1 and h2 that are filled with the material of the metal layer 4416.

Figure 20C:
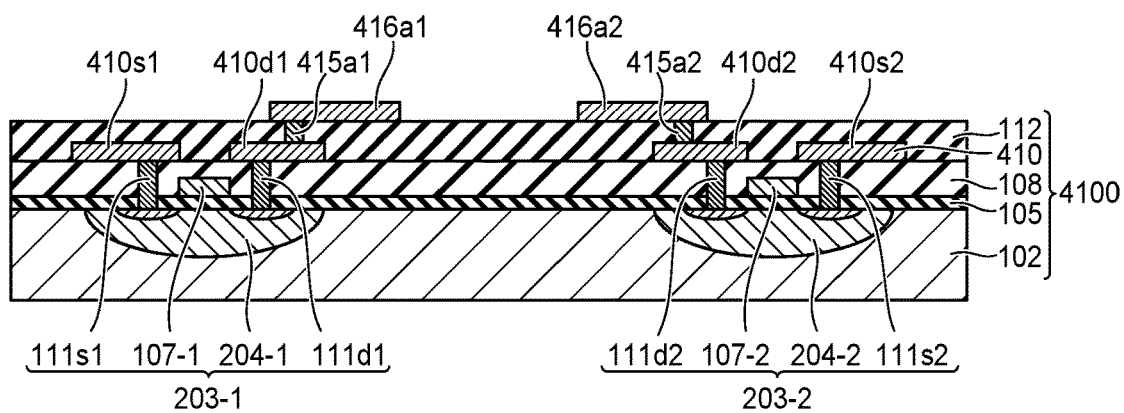
FIG. 20C is a schematic cross-sectional view illustrating the method for manufacturing the image display device of the modification of the fourth embodiment.

As shown in FIG. 20C, the plugs 416*a*1 and 416*a*2 are formed on the connection portions 415*a*1 and 415*a*2 by photolithography and dry etching.

The plugs may be formed directly on the wiring portions 410*d*1 and 410*d*2 without forming the connection portions 415*a*1 and 415*a*2.

Figure 21A:
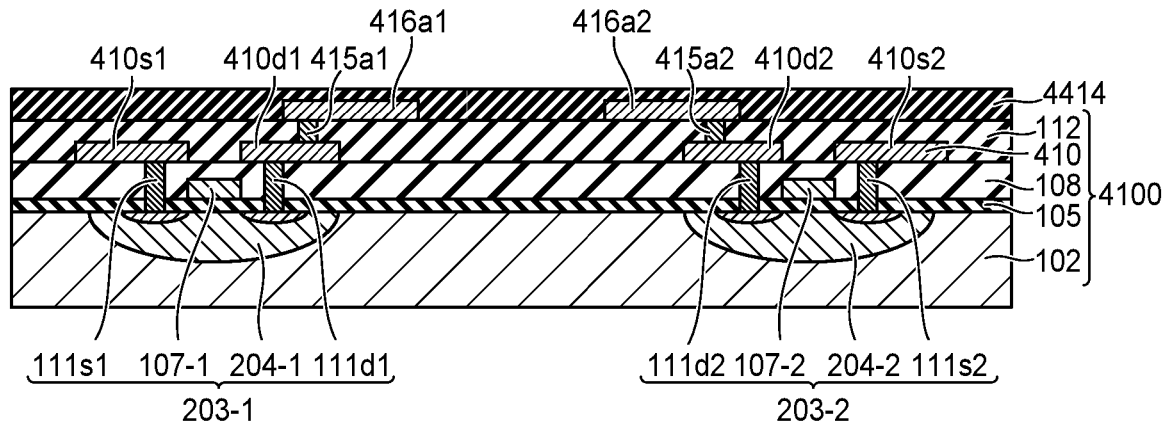
FIG. 21A is a schematic cross-sectional view illustrating the method for manufacturing the image display device of the modification of the fourth embodiment.

As shown in FIG. 21A, a planarization film 4414 is coated to cover the inter-layer insulating film 112 and the plugs 416*a*1 and 416*a*2, and is subsequently baked. The planarization film 4414 is formed to be thicker than the thickness of the plugs 416*a*1 and 416*a*2. Subsequently, the surface of the planarization film 4414 is polished. For example, CMP (Chemical Mechanical Polishing) is used to polish the planarization film 4414.

Figure 21B:
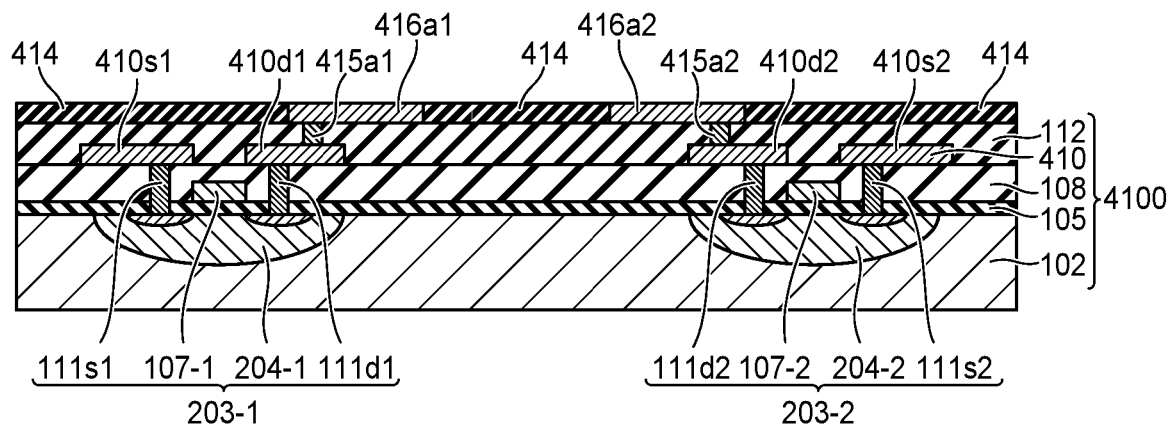
FIG. 21B is a schematic cross-sectional view illustrating the method for manufacturing the image display device of the modification of the fourth embodiment.

As shown in FIG. 21B, the planarization film 414 is formed when the surfaces of the plugs 416*a*1 and 416*a*2 are exposed by the polishing. Thus, the plugs 416*a*1 and 416*a*2 and the connection portions 415*a*1 and 415*a*2 are formed.

Figure 22A:
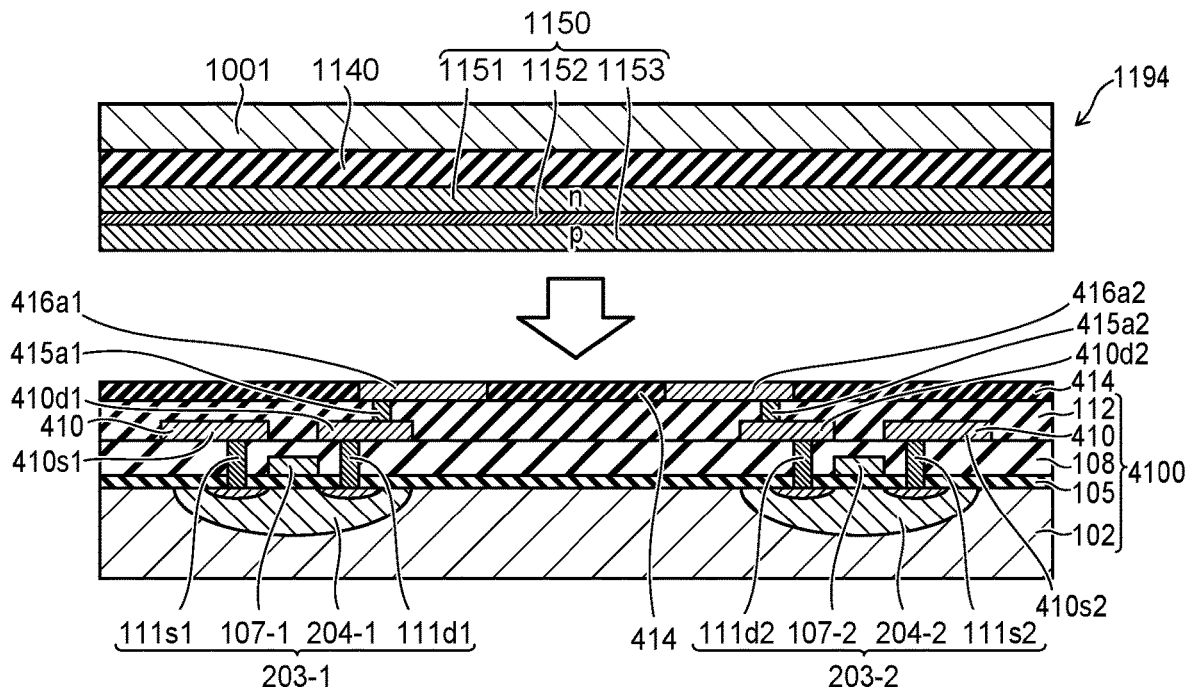
FIG. 22A is a schematic cross-sectional view illustrating the method for manufacturing the image display device of the modification of the fourth embodiment.

Furthermore, as shown in FIG. 22A, the semiconductor growth substrate 1194 and the circuit board 4100 in which the plugs 416*a*1 and 416*a*2 are formed are prepared. The semiconductor growth substrate 1194 and the circuit board 4100 that are prepared are bonded to each other.

Figure 22B:
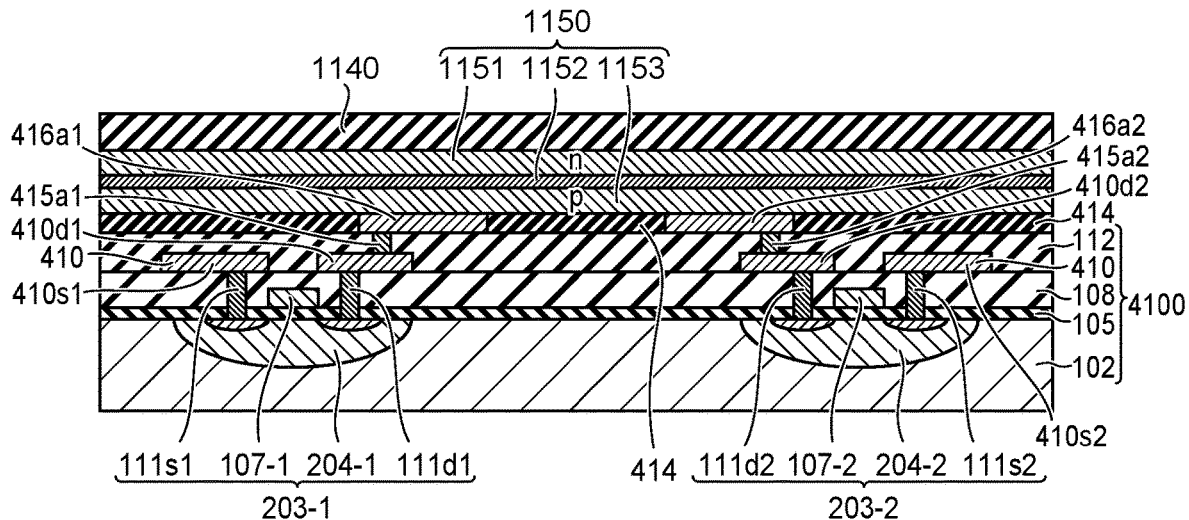
FIG. 22B is a schematic cross-sectional view illustrating the method for manufacturing the image display device of the modification of the fourth embodiment.

As shown in FIG. 22B, after the semiconductor layer 1150 is bonded to the circuit board 4100 in which the plugs 416*a*1 and 416*a*2 are formed, the crystal growth substrate 1001 is removed by laser lift-off, etc.

Figure 23A:
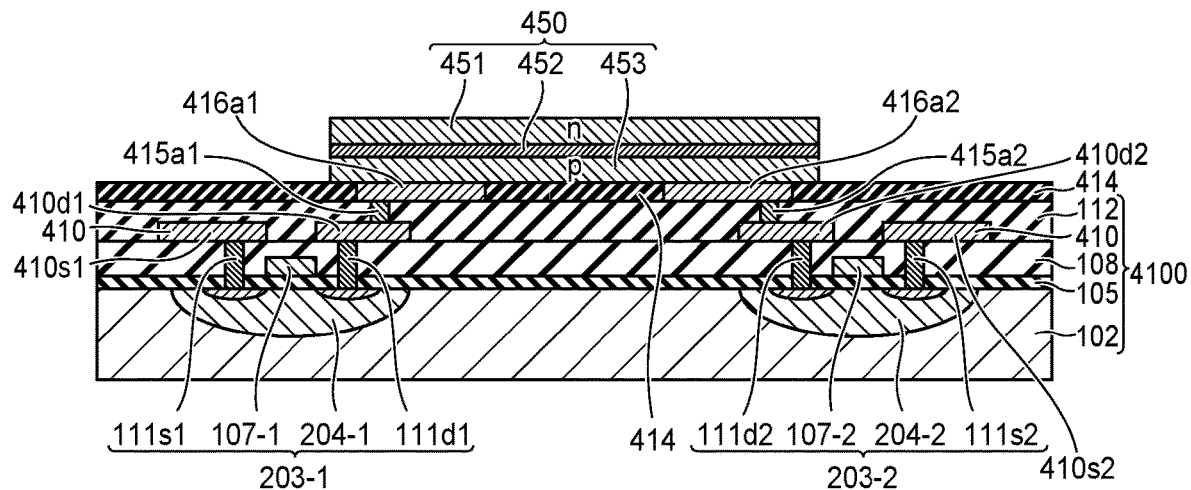
FIG. 23A is a schematic cross-sectional view illustrating the method for manufacturing the image display device of the modification of the fourth embodiment.

As shown in FIG. 23A, the semiconductor layer 450 is formed by etching the semiconductor layer 1150.

Figure 23B:
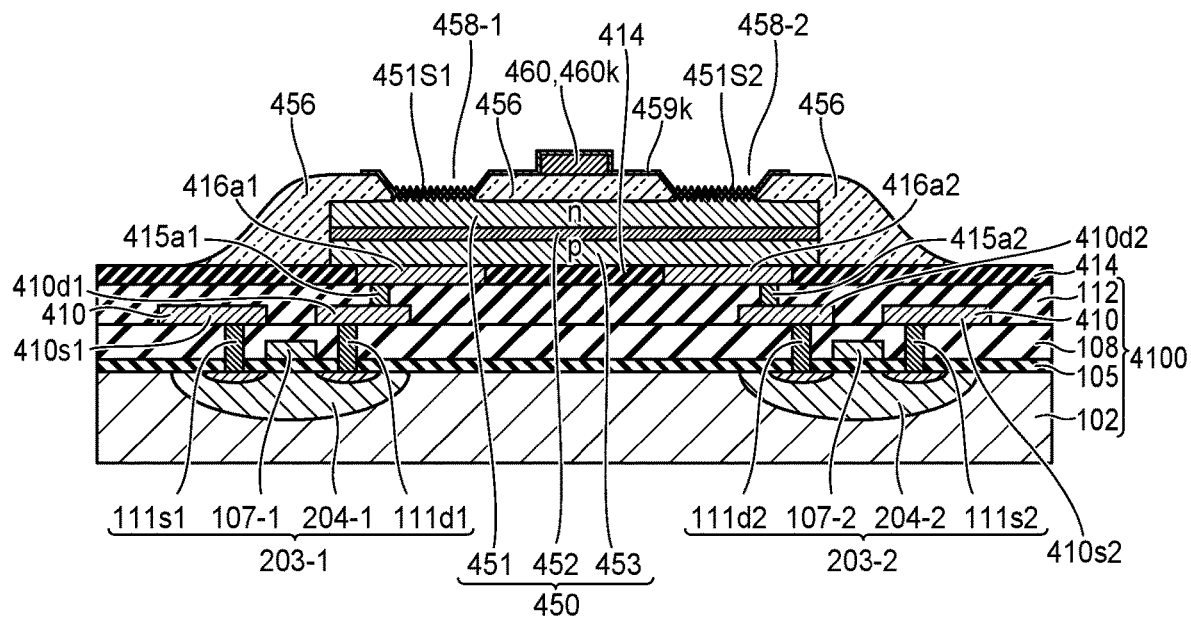
FIG. 23B is a schematic cross-sectional view illustrating the method for manufacturing the image display device of the modification of the fourth embodiment.

As shown in FIG. 23B, the insulating member 456 that covers the semiconductor layer 450 and a portion of the planarization film 414 is formed.

The wiring layer 460 is formed on the insulating member 456, and the wiring portion 460*k*, etc., are formed by etching.

The openings 458-1 and 458-2 are formed by removing the insulating member 456 respectively at positions corresponding to the light-emitting surfaces 451S1 and 451S2.

The light-emitting surfaces 451S1 and 451S2 that are exposed by the openings 458-1 and 458-2 each are roughened. Subsequently, the light-transmitting electrode 459*k* is formed to electrically connect the light-emitting surfaces 451S1 and 451S2 and the wiring portion 460*k*.

Thus, the subpixel group 420 that shares the semiconductor layer 450 that includes the two light-emitting surfaces 451S1 and 451S2 is formed.

Although the two light-emitting surfaces 451S1 and 451S2 are provided in one semiconductor layer 450 according to the example, the number of light-emitting surfaces is not limited to two; it is also possible to provide three or more light-emitting surfaces in one semiconductor layer 450. As an example, one column or two columns of subpixels may be realized in a single semiconductor layer 450. As described below, a recombination current that does not contribute to the light emission per light-emitting surface can be reduced thereby, and the effect of realizing a finer light-emitting element can be increased.

(Modification)

Figure 24:
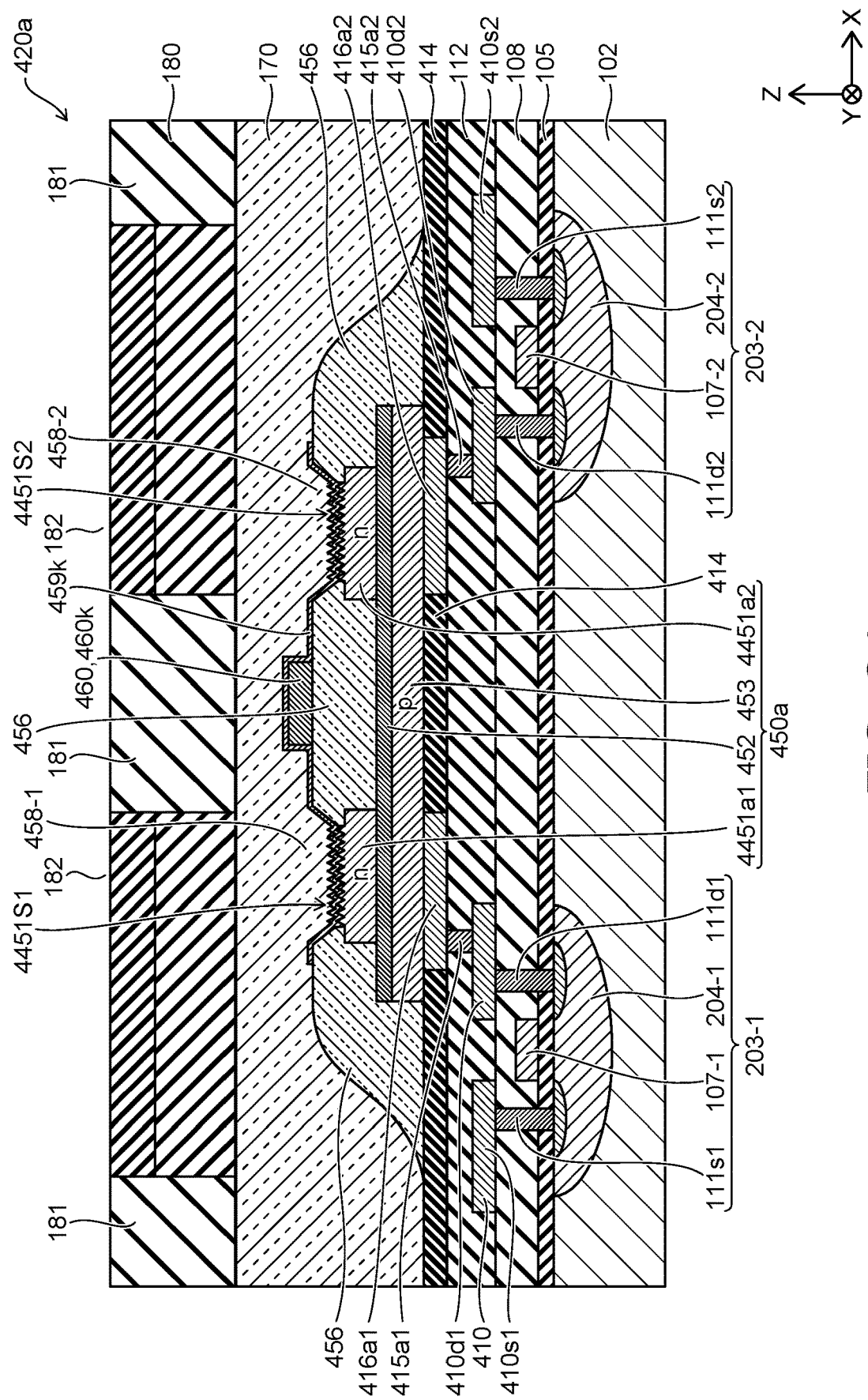
FIG. 24 is a schematic cross-sectional view illustrating a portion of an image display device according to a modification of the fourth embodiment.

FIG. 24 is a schematic cross-sectional view illustrating a portion of an image display device according to a modification of the embodiment.

The modification differs from the fourth embodiment described above in that two n-type semiconductor layers 4451*a*1 and 4451*a*2 are located on the light-emitting layer 452. Otherwise, the modification is the same as the fourth embodiment; the same components are marked with the same reference numerals, and a detailed description is omitted as appropriate.

As shown in FIG. 24, the image display device of the modification includes a subpixel group 420*a*. The subpixel group 420*a* includes a semiconductor layer 450*a*. The semiconductor layer 450*a* includes the p-type semiconductor layer 453, the light-emitting layer 452, and the n-type semiconductor layers 4451*a*1 and 4451*a*2. The p-type semiconductor layer 453, the light-emitting layer 452, and the n-type semiconductor layers 4451*a*1 and 4451*a*2 are stacked in this order from the insulating member 456 toward the side of light-emitting surfaces 4451S1 and 4451S2.

The n-type semiconductor layers 4451*a*1 and 4451*a*2 are provided to be separated along the X-axis direction on the light-emitting layer 452. The insulating member 456 is located between the n-type semiconductor layers 4451*a*1 and 4451*a*2, and the n-type semiconductor layers 4451*a*1 and 4451*a*2 are separated by the insulating member 456.

The n-type semiconductor layers 4451*a*1 and 4451*a*2 have substantially the same shape when projected onto the XY plane, and the shape is a substantially square or rectangular shape, and may be another polygonal shape, circular, etc.

The n-type semiconductor layers 4451*a*1 and 4451*a*2 respectively include the light-emitting surfaces 4451S1 and 4451S2. The light-emitting surfaces 4451S1 and 4451S2 are surfaces of the n-type semiconductor layers 4451*a*1 and 4451*a*2 that are exposed respectively by the openings 458-1 and 458-2.

Similarly to the shape of the light-emitting surface according to the fourth embodiment, the shapes of the light-emitting surfaces 4451S1 and 4451S2 when projected onto the XY plane are substantially the same shape, and are a shape that is substantially square, etc. The shapes of the light-emitting surfaces 4451S1 and 4451S2 are not limited to rectangular such as that of the embodiment, and may be circular, elliptical, polygonal such as hexagonal, etc. The shapes of the light-emitting surfaces 4451S1 and 4451S2 may be similar to the shapes of the openings 458-1 and 458-2, or may be different shapes.

The light-transmitting electrode 459*k* is located on each of the light-emitting surfaces 4451S1 and 4451S2. The light-transmitting electrode 459*k* is located also on the wiring portion 460*k*. The light-transmitting electrode 459*k* is located between the wiring portion 460*k* and the light-emitting surface 4451S1 and is located between the wiring portion 460*k* and the light-emitting surface 4451S2. The light-transmitting electrode 459*k* electrically connects the wiring portion 460*k* and the light-emitting surfaces 4451S1 and 4451S2.

Figure 25A:
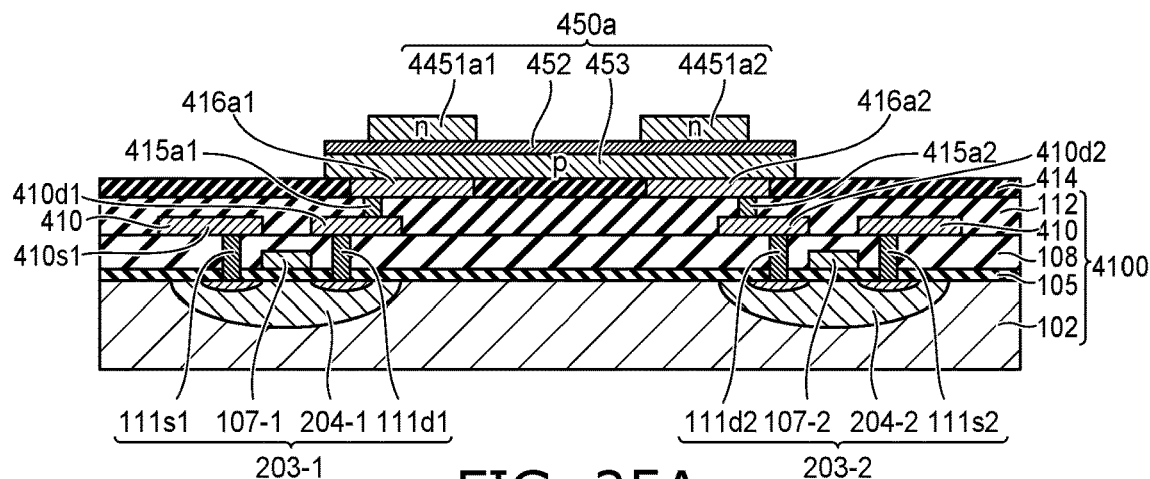
FIG. 25A is a schematic cross-sectional view illustrating a method for manufacturing the image display device of the modification of the fourth embodiment.
Figure 25B:
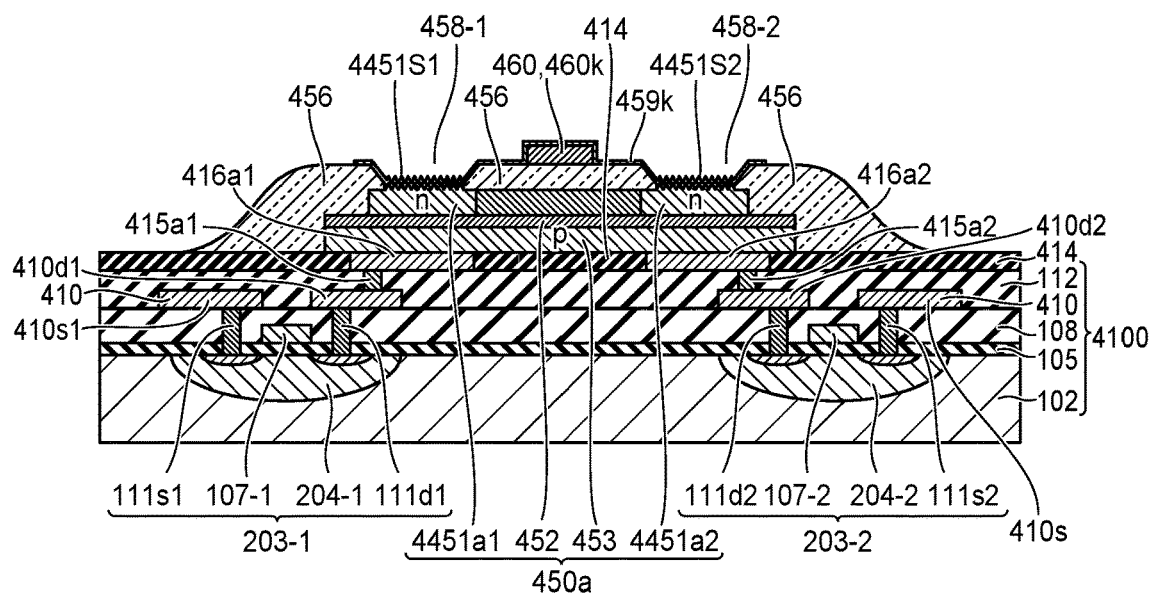
FIG. 25B is a schematic cross-sectional view illustrating the method for manufacturing the image display device of the modification of the fourth embodiment.

FIGS. 25A and 25B are schematic cross-sectional views illustrating a method for manufacturing the image display device of the modification.

Processes similar to the processes described in reference to FIGS. 20A to 22B according to the fourth embodiment are applied to the modification up to the bonding to the semiconductor layer 1150 of the circuit board 4100 in which the plugs 416*a*1 and 416*a*2 and the connection portions 415*a*1 and 415*a*2 are formed. The subsequent processes will now be described.

According to the modification as shown in FIG. 25A, the buffer layer 1140 of FIG. 22B is removed; the light-emitting layer 452 and the p-type semiconductor layer 453 are formed by etching the p-type semiconductor layer 1153, the light-emitting layer 1152, and the n-type semiconductor layer 1151; subsequently, the two n-type semiconductor layers 4451*a*1 and 4451*a*2 are formed by further etching.

The n-type semiconductor layers 4451*a*1 and 4451*a*2 may be formed by performing even deeper etching. For example, etching for forming the n-type semiconductor layers 4451*a*1 and 4451*a*2 may be performed to a depth that reaches the interior of the light-emitting layer 452 and the interior of the p-type semiconductor layer 453. Thus, when deeply etching the n-type semiconductor layer, it is desirable for the etching position of the n-type semiconductor layer 1151 to be separated from the outer perimeters of the light-emitting surfaces 4451S1 and 4451S2 of the n-type semiconductor layer described below by not less than 1 μm. The recombination current can be suppressed by setting the etching position to be separated from the outer perimeters of the light-emitting surfaces 4451S1 and 4451S2.

As shown in FIG. 25B, the insulating member 456 that covers the planarization film 414, the plugs 416*a*1 and 416*a*2, and the semiconductor layer 450*a* is formed. The wiring layer 460 is formed on the insulating member 456; the wiring portion 460*k*, etc., are formed by etching.

The openings 458-1 and 458-2 are formed in the insulating member 456 at positions that correspond respectively to the light-emitting surfaces 4451S1 and 4451S2. The light-emitting surfaces 4451S1 and 4451S2 of the n-type semiconductor layer that are exposed by the openings 458-1 and 458-2 each are roughened. Subsequently, the light-transmitting electrode 459*k* is formed.

Thus, the subpixel group 420*a* that includes the two light-emitting surfaces 4451S1 and 4451S2 is formed.

According to the modification as well, similarly to the fourth embodiment, the number of light-emitting surfaces is not limited to two; three or more light-emitting surfaces may be provided in one semiconductor layer 450*a*.

Effects of the image display device of the embodiment will now be described.

Figure 26:
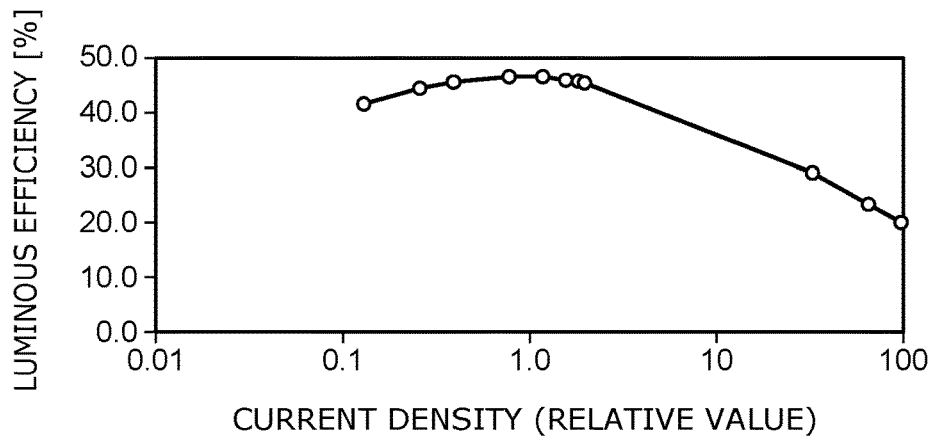
FIG. 26 is a graph illustrating a characteristic of a pixel LED element.

FIG. 26 is a graph illustrating a characteristic of a pixel LED element.

The vertical axis of FIG. 26 illustrates the luminous efficiency (%). The horizontal axis illustrates the current density of the current caused to flow in the pixel LED element as a relative value.

As shown in FIG. 26, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 26 that there is a tendency for the current density to decrease and for the luminous efficiency to decrease for a low current density.

As described according to the first to third embodiments, the light-emitting element is formed by individually singulating by etching or the like of all of the layers of the semiconductor layer 1150 that include the light-emitting layer. At this time, the bonding surface between the light-emitting layer and the n-type semiconductor layer is exposed at the end portion. Similarly, the bonding surface between the light-emitting layer and the p-type semiconductor layer is exposed at the end portion.

When such an end portion exists, electrons and holes recombine at the end portion. On the other hand, such recombination does not contribute to the light emission. The recombination at the end portion occurs substantially regardless of the current caused to flow in the light-emitting element. It is considered that the recombination occurs according to the length of the bonding surface that contributes to the light emission of the end portion.

When two light-emitting elements that have cubic shapes of the same dimensions emit light, end portions are formed at four sides for each light-emitting element; therefore, recombination may occur at a total of eight end portions.

Conversely, according to the embodiment, there are four end portions in the semiconductor layers 450 and 450a that include two light-emitting surfaces. The region between the openings 458-1 and 458-2 substantially does not contribute to the light emission because few electrons and holes are injected into this region; therefore, the end portions that contribute to the light emission can be considered to be six. Thus, according to the embodiment, by substantially reducing the number of end portions of the semiconductor layer, the recombination that does not contribute to the light emission can be reduced, and the reduction of the recombination current makes it possible to reduce the drive current.

When shortening the distance between the subpixels for higher definition or the like, when the current density is relatively high, etc., the distance between the light-emitting surfaces 451S1 and 451S2 becomes short in the subpixel group 420 of the fourth embodiment. In such a case, when the n-type semiconductor layer 451 is shared, there is a risk that a portion of the electrons injected into the adjacent light-emitting surface side may shunt, and the light-emitting surface at the side that is not driven may have a micro light emission. According to the modification, the n-type semiconductor layers 4451a1 and 4451a2 are separated for each of the light-emitting surfaces 4451S1 and 4451S2; therefore, the occurrence of a micro light emission at the light-emitting surface at the side that is not driven can be reduced.

According to the embodiment, the semiconductor layer that includes the light-emitting layer includes the p-type semiconductor layer, the light-emitting layer, and the n-type semiconductor layer that are stacked in this order from the inter-layer insulating film 112 side, and is favorable from the perspective of increasing the luminous efficiency by roughening the exposed surface of the n-type semiconductor layer. Similarly to the other embodiments described above, the n-type semiconductor layer, the light-emitting layer, and the p-type semiconductor layer may be stacked in this order by replacing the stacking order of the p-type semiconductor layer and the n-type semiconductor layer.

Fifth Embodiment

The image display device described above can be used as an image display module having the appropriate number of pixels in, for example, a computer display, a television, a portable terminal such as a smartphone, car navigation, etc.

Figure 27:
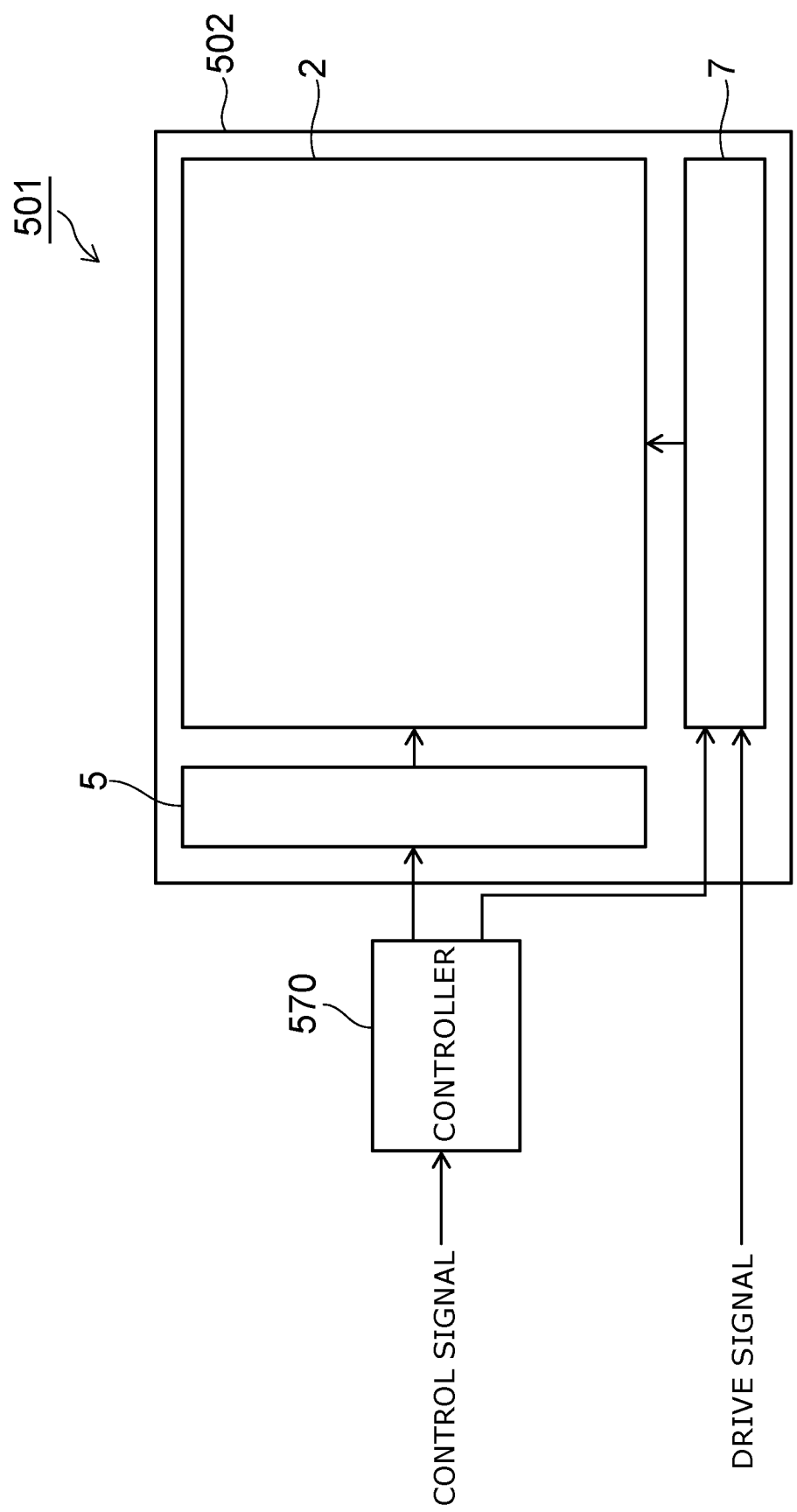
FIG. 27 is a block diagram illustrating an image display device according to a fifth embodiment.

FIG. 27 is a block diagram illustrating the image display device according to the embodiment.

Major parts of the configuration of a computer display are shown in FIG. 27.

As shown in FIG. 27, the image display device 501 includes an image display module 502. The image display module 502 is, for example, an image display device that includes the configuration according to the first embodiment described above. The image display module 502 includes the display region 2 in which the subpixels 20 are arranged, the row selection circuit 5, and the signal voltage output circuit 7. The image display device 501 may include the configurations according to the second and third embodiments.

The image display device 501 further includes a controller 570. The controller 570 receives input of control signals that are separated and generated by not-illustrated interface circuitry, and controls the driving and the drive sequence of the subpixels in the row selection circuit 5 and the signal voltage output circuit 7.

(Modification)

Figure 28:
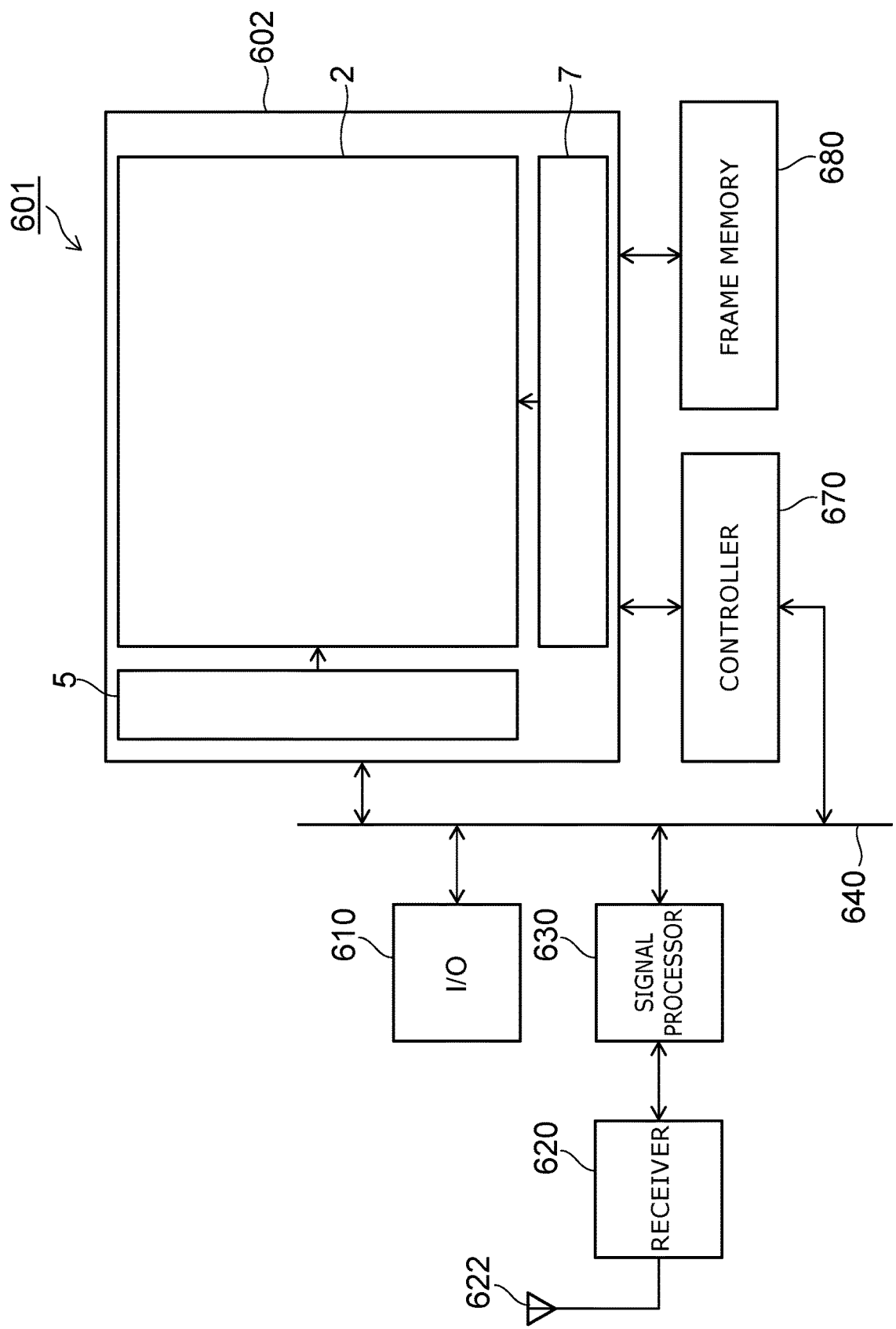
FIG. 28 is a block diagram illustrating an image display device according to a modification of the fifth embodiment.

FIG. 28 is a block diagram illustrating an image display device of the modification.

The configuration of a high-definition thin television is shown in FIG. 28.

As shown in FIG. 28, the image display device 601 includes an image display module 602. The image display module 602 is, for example, the image display device 1 that includes the configuration according to the first embodiment described above. The image display device 601 includes a controller 670 and a frame memory 680. Based on a control signal supplied by a bus 640, the controller 670 controls the drive sequence of the subpixels of the display region 2. The frame memory 680 stores one frame of display data and is used for smooth processing such as video image reproduction, etc.

The image display device 601 includes an I/O circuit 610. The I/O circuit 610 provides interface circuitry and the like for connecting with external terminals, devices, etc. The I/O circuit 610 includes, for example, a USB interface that connects an external hard disk device or the like, an audio interface, etc.

The image display device 601 includes a receiver 620 and a signal processor 630. An antenna 622 is connected to the receiver 620, and the necessary signal is separated and generated from the radio wave received by the antenna 622. The signal processor 630 includes a DSP (Digital Signal Processor), a CPU (Central Processing Unit), etc., and the signal that is separated and generated by the receiver 620 is separated and generated into image data, audio data, etc., by the signal processor 630.

Other image display devices also can be made by using the receiver 620 and the signal processor 630 as a high frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment or other embodiments may be used.

According to embodiments described above, a method for manufacturing an image display device and an image display device can be realized in which the transfer process of the light-emitting elements is shortened and the yield is increased.

Figure 29:
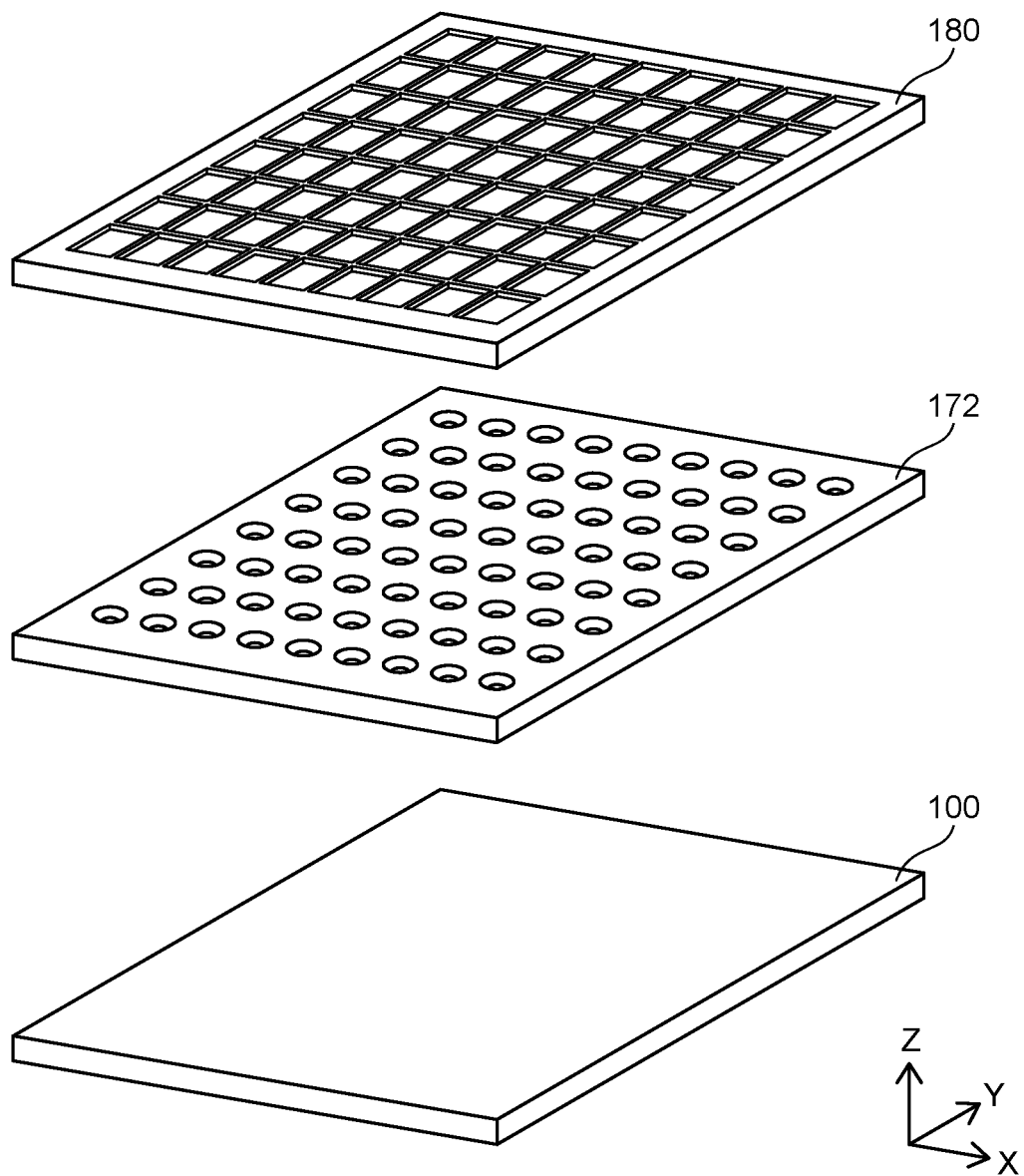
FIG. 29 is a perspective view schematically illustrating image display devices of the first to fourth embodiments and modifications of the first to fourth embodiments.

FIG. 29 is a perspective view schematically illustrating the image display device of the first to fourth embodiments and modifications of the first to fourth embodiments.

As shown in FIG. 29, in the image display device of the first to fourth embodiments, the light-emitting circuit 172 that includes many subpixels on the circuit board 100 is provided as described above. The color filter 180 is located on the light-emitting circuit part 172. According to the fifth embodiment, the structural component that includes the circuit board 100, the light-emitting circuit part 172, and the color filter 180 is used as the image display modules 502 and 602 and is embedded in the image display devices 501 and 601.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions and equivalents recited in the claims. Also, embodiments described above can be implemented in combination with each other.

What is claimed is:

1. A method for manufacturing an image display device, the method comprising:
    providing a second substrate that comprises a first substrate, and a semiconductor layer on the first substrate, the semiconductor layer comprising a light-emitting layer;
    providing a third substrate comprising a circuit, the circuit comprising a circuit element;
    bonding the semiconductor layer to the third substrate;
    forming a light-emitting element by etching the semiconductor layer;
    covering the light-emitting element with a light-transmissive insulating member; and
    forming a wiring layer electrically connecting the light-emitting element to the circuit element; wherein:
    the light-emitting element has a light-emitting surface opposite to a surface of the light-emitting element that is bonded to the third substrate; and
    the insulating member is configured to cause light radiated from the light-emitting element to have a light distribution in a normal direction of the light-emitting surface toward a light-emitting surface side.

2. The method for manufacturing the image display device according to claim 1, further comprising:
    before the step of bonding the semiconductor layer to the third substrate, forming a light-reflective layer on at least one of on the semiconductor layer or the third substrate;
    wherein:
    the semiconductor layer is bonded to the third substrate via the light-reflective layer.

3. The method for manufacturing the image display device according to claim 1, further comprising:
    before the step of bonding the semiconductor layer to the third substrate, removing the first substrate.

4. The method for manufacturing the image display device according to claim 1, further comprising:
    after the step of bonding the semiconductor layer to the third substrate, removing the first substrate.

5. The method for manufacturing the image display device according to claim 1, wherein:
    the semiconductor layer comprises an n-type semiconductor layer, the light-emitting layer, and a p-type semiconductor layer, stacked in this order from a first substrate side.

6. The method for manufacturing the image display device according to claim 5, wherein:
    the step of forming the light-emitting element comprises patterning the light-emitting element to cause a surface area of the p-type semiconductor layer to be greater than a surface area of the n-type semiconductor layer in a plan view from the light-emitting surface side.

7. The method for manufacturing the image display device according to claim 1, further comprising:
    exposing the light-emitting surface of the light-emitting element from the insulating member.

8. The method for manufacturing the image display device according to claim 7, further comprising:
    forming a roughened surface in an exposed surface of the light-emitting surface.

9. The method for manufacturing the image display device according to claim 7, further comprising:
    forming a light-transmissive electrode at an exposed surface of the light-emitting surface.

10. The method for manufacturing the image display device according to claim 1, wherein:
    the first substrate comprises silicon or sapphire.

11. The method for manufacturing the image display device according to claim 1, wherein:
    the semiconductor layer comprises a gallium nitride compound semiconductor, and
    the third substrate comprises silicon.

12. The method for manufacturing the image display device according to claim 1, further comprising:
    forming a wavelength conversion member on the light-emitting element.

* * * * *